US010612129B2

(12) United States Patent
Cherekdjian et al.

(10) Patent No.: US 10,612,129 B2
(45) Date of Patent: Apr. 7, 2020

(54) THIN GLASS BASED ARTICLE WITH HIGH RESISTANCE TO CONTACT DAMAGE

(71) Applicant: CORNING INCORPORATED, Corning, NY (US)

(72) Inventors: Sarko Cherekdjian, Campbell, CA (US); Benedict Osobomen Egboiyi, Painted Post, NY (US); William Brashear Mattingly, III, Painted Post, NY (US); Michael Yoshiya Nishimoto, Horseheads, NY (US); Toshihiko Ono, Shizuoka (JP); Prakash Chandra Panda, Ithaca, NY (US); Trevor Edward Wilantewicz, Sunnyvale, CA (US)

(73) Assignee: CORNING INCORPORATED, Corning, NY (US)

( * ) Notice: Subject to any disclaimer, the term of this patent is extended or adjusted under 35 U.S.C. 154(b) by 166 days.

(21) Appl. No.: 15/630,272

(22) Filed: Jun. 22, 2017

(65) Prior Publication Data
US 2017/0369989 A1    Dec. 28, 2017

Related U.S. Application Data

(60) Provisional application No. 62/355,437, filed on Jun. 28, 2016.

(51) Int. Cl.
C23C 14/18    (2006.01)
C23C 14/48    (2006.01)
(Continued)

(52) U.S. Cl.
CPC .............. *C23C 14/48* (2013.01); *C03C 3/087* (2013.01); *C03C 3/091* (2013.01); *C03C 3/093* (2013.01);
(Continued)

(58) Field of Classification Search
CPC ................................. C23C 14/18; C23C 14/28
See application file for complete search history.

(56) References Cited

U.S. PATENT DOCUMENTS 4,521,443 A    6/1985  Naik et al.
5,250,098 A *  10/1993 Platts .................... C03C 23/008
                                                427/165
(Continued)

FOREIGN PATENT DOCUMENTS

DE    19633850 A1    2/1998
EP     0318440 B1    5/1993
(Continued)

OTHER PUBLICATIONS

Arnold et al. "Characterization of the near-surface region of glass implanted with light elements" Journal of Non-Crystalline Solids 120 (1990) pp. 234-240.
(Continued)

*Primary Examiner* — Ellen M McAvoy
(74) *Attorney, Agent, or Firm* — John P. McGroarty

(57) ABSTRACT

Provided herein are ion-implanted glass based articles with improved flaw suppression properties. The ion-implanted glass based articles generally have a final indent fracture threshold (IFT) load of at least 650 grams, and/or a scratch threshold force of at least 10 N, which represents at least 1.25-fold enhancement compared to the glass based article prior to ion-implantation. Factors affecting the efficacy of the ion implantation process can include the IFT load of the starting glass or glass ceramic substrate (native IFT load), ion type, ion dose, implant energy, beam current, and glass temperature.

15 Claims, 15 Drawing Sheets

(51) Int. Cl.

| | | |
|---|---|---|
| *C03C 3/091* | (2006.01) | |
| *C03C 3/087* | (2006.01) | |
| *C03C 3/093* | (2006.01) | |
| *C03C 23/00* | (2006.01) | |
| *C03C 3/097* | (2006.01) | |
| *H05K 5/00* | (2006.01) | |
| *H05K 5/03* | (2006.01) | |

(52) U.S. Cl.
CPC .......... *C03C 3/097* (2013.01); *C03C 23/0055* (2013.01); *H05K 5/0017* (2013.01); *H05K 5/03* (2013.01)

(56) References Cited

U.S. PATENT DOCUMENTS

| | | | |
|---|---|---|---|
| 9,133,545 B2* | 9/2015 | Borrelli | C03C 17/22 |
| 2011/0140005 A1* | 6/2011 | Kang | C23C 14/48 |
| | | | 250/492.3 |
| 2014/0154511 A1* | 6/2014 | Ho | C03C 23/0055 |
| | | | 428/410 |
| 2015/0239776 A1 | 8/2015 | Amin et al. | |
| 2015/0376058 A1 | 12/2015 | Busardo et al. | |
| 2016/0052821 A1 | 2/2016 | Busardo et al. | |
| 2016/0056068 A1* | 2/2016 | Hu | H01L 21/76254 |
| | | | 428/220 |
| 2018/0361713 A1* | 12/2018 | Nagata | C03C 17/27 |
| 2019/0119154 A1* | 4/2019 | Navet | C03C 23/0055 |

FOREIGN PATENT DOCUMENTS

| | | |
|---|---|---|
| EP | 0380138 B1 | 8/1994 |
| EP | 3181533 A1 | 6/2017 |
| GB | 2234968 A | 2/1991 |
| JP | 2007238378 A | 9/2007 |
| JP | 2010001183 A | 1/2010 |
| WO | 2005080285 A1 | 9/2005 |
| WO | 2010092297 A1 | 8/2010 |

OTHER PUBLICATIONS

Arnold, "Section 8. Silica and silicate glasses: ion implementation, corrosion, natural occurrence, precipitated iron particles, internal friction" Journal of Non-Crystalline Solids 179 (1994) pp. 288-299.
Burnett and Page, "An investigation of ion implantation-induced near-surface stresses and their effects in sapphire and glass" Journal of Materials Science 20 (1985) 4624-4646.
Chengyu et al. "Effect of nitrogen ion-implantation on silicate glasses" Journal of Non-Crystalline Solids 52 (1982) pp. 589-603.
Li et al. "Effects of nitrogen and carbon ion implantation on devitrification of silica glasses" Journal of Non-Crystalline Solids 168 (1993) pp. 56-63.
Nakagawa, et al., in "Establishment of Evaluation Method of Surface Fracture Mode with Front-side-origin for Cover Glass" SID Symposium Digest of Technical Papers. 44(1) pp. 1148-1151 (2013).
Oyoshi et al. "Formation of buried oxynitride layers in silica glass by ion implantation" Journal of Applied Physics, 68(7) Oct. 1990, pp. 3653-3660.
Toth et al, "Fracture properties of ion-implanted surfaces of silica glasses investigated by Vickers Indentation Measurements" Key Engineering Materials, vol. 223, (2002) pp. 47-54.
International Search Report and Written Opinion of the International Searching Authority; PCT/US2017/039204; dated Sep. 19, 2017; European Patent Office.

\* cited by examiner

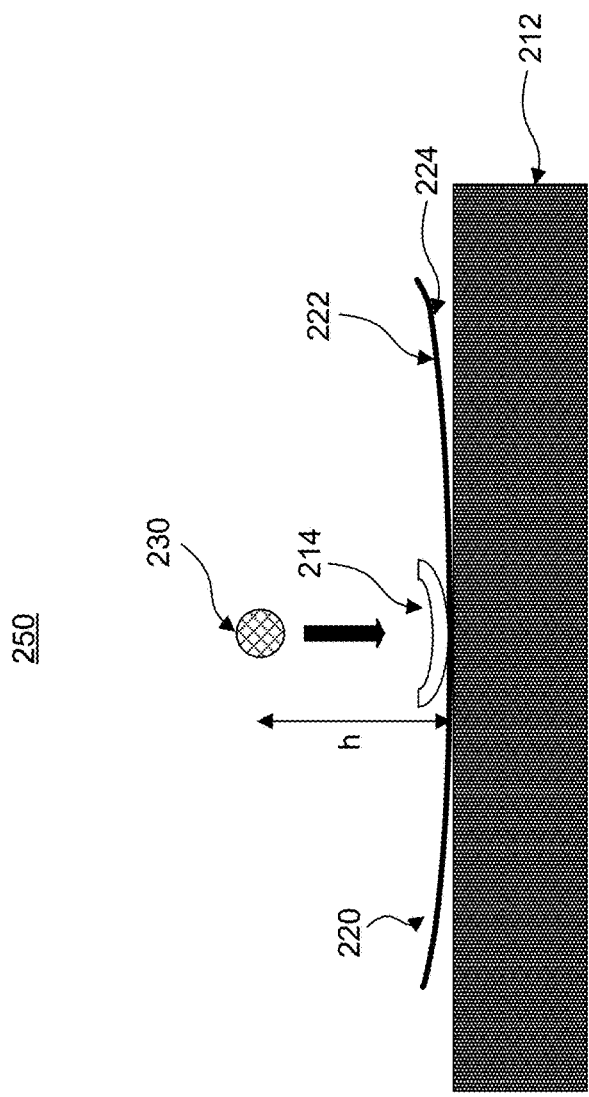

THIN GLASS BASED ARTICLE WITH HIGH RESISTANCE TO CONTACT DAMAGE

CROSS-REFERENCE TO RELATED APPLICATIONS

This application claims the benefit of priority under 35 U.S.C. § 119 of U.S. Provisional Application Ser. No. 62/355,437 filed on Jun. 28, 2016, the content of which is relied upon and incorporated herein by reference in its entirety.

FIELD AND BACKGROUND OF THE DISCLOSURE

The present disclosure is generally related to strengthening glass based articles, e.g., through ion-implantation.

Glass is a brittle material which can sometimes break during use. Generally, treatments are employed to minimize breakage and other damage, such as scratches. The treatments are designed to minimize the number, the depth, or the growth of flaws.

Examples of these treatments include stress based treatments such as thermal tempering and ion exchange. Tempering and ion exchange impart stress into the glass; namely compressive stresses on the near-surface, balanced by tension in the interior. One disadvantage of using stress-based treatments is that the mechanical property enhancement becomes more limited as the glass based article gets thinner. Glass based articles used in displays, such as computer monitors, laptops, tablets, handheld devices, or screen protectors, are generally driven toward thinner glass. Thinner glass enables the display product to be thinner, lighter, and cheaper, especially in mobile applications. Thinner glass limits the effectiveness of stress-based treatments since there is less interior glass to balance the compressive stress in the near surface glass.

BRIEF SUMMARY

In various embodiments, an ion-implanted glass based article is provided. In some embodiments, the ion-implanted glass based article comprises a glass or glass ceramic substrate comprising at least one ion-implanted surface. In some embodiments, the glass or glass ceramic substrate comprises an ion-implantation layer (e.g., implanted with ions such as, but not limited to, $N^+$, $Si^+$, $BF_2^+$, $P^+$, $SiF_3^+$, and/or $N_2^+$) under the at least one surface with an average depth of ions implanted in the layer not more than 5 μm (e.g., not more than 4 μm, not more than 3 μm, not more than 2 μm, or not more than 1 μm). In some embodiments, the glass or glass ceramic substrate comprises an ion-implantation layer (e.g., implanted with ions such as, but not limited to, $N^+$, $Si^+$, $BF_2^+$, $P^+$, $SiF_3^+$, $N_2^+$ or a combination thereof) under the at least one surface having a thickness of about 1 μm, about 0.8 μm, about 0.5 μm, about 0.2 μm, about 0.1 μm, or any ranges between the specified values. In some embodiments, the ions (e.g., $N^+$, $Si^+$, $BF_2^+$, $P^+$, $SiF_3^+$, and/or $N_2^+$) implanted under the at least one surface are at a dose ranging from about $4\times10^{14}$ ions/cm$^2$ to about $2.1\times10^{17}$ ions/cm$^2$ (e.g., about $4\times10^{14}$ ions/cm$^2$ to about $5\times10^{15}$ ions/cm$^2$ or about $4\times10^{14}$ ions/cm$^2$ to about $1\times10^{16}$ ions/cm$^2$). In some embodiments, the initial IFT load of the glass or glass ceramic substrate is at least 100 grams. In some embodiments, the initial indent fracture threshold (IFT) load of the glass or glass ceramic substrate prior to ion implantation is about 100 grams, about 150 grams, about 200 grams, about 400 grams, about 600 grams, about 800 grams, about 1000 grams, or any ranges between the specified values. Glass or glass ceramic substrates having an initial IFT of at least 100 grams prior to ion implantation are known in the art. In some embodiments, the glass or glass ceramic substrate is not suitable for an ion-exchange process. In some embodiments, the glass or glass ceramic substrate comprises an ion-exchanged glass or glass ceramic substrate. In some embodiments, the glass or glass ceramic substrate comprises an alkali or alkali-free glass composition, an alkaline earth boroaluminosilicate glass composition, or an alkali aluminosilicate glass composition. Other suitable glass or glass ceramic substrates are described herein. In some embodiments, the glass or glass ceramic substrate has a mean thickness of not more than 2 mm (e.g., not more than 0.7 mm).

Certain embodiments are directed to an ion-implanted glass based article characterized by its final IFT load. In some embodiments, the ion-implanted glass based article comprises a glass or glass ceramic substrate comprising at least one ion-implanted surface. In some embodiments, the ion-implanted glass based article is characterized by having a final indent fracture threshold (IFT) load of at least 650 grams (e.g., 650 grams to about 5000 grams). In some embodiments, the at least one surface is implanted with ions such as, but not limited to, $N^+$, $Si^+$, $BF_2^+$, $P^+$, $SiF_3^+$, $N_2^+$, or a combination thereof. In some embodiments, the ions are implanted at a dose ranging from about $4\times10^{14}$ ions/cm$^2$ to about $2.1\times10^{17}$ ions/cm$^2$ (e.g., about $4\times10^{14}$ ions/cm$^2$ to about $5\times10^{15}$ ions/cm$^2$ or about $4\times10^{14}$ ions/cm$^2$ to about $1\times10^{16}$ ions/cm$^2$). In some embodiments, the ion-implanted glass based article comprises a glass or glass ceramic substrate that is not suitable for an ion-exchange process. In some embodiments, the ion-implanted glass based article comprises an ion-exchanged glass or glass ceramic substrate. In some embodiments, the glass or glass ceramic substrate comprises an alkali or alkali-free glass composition, an alkaline earth boroaluminosilicate glass composition, or an alkali aluminosilicate glass composition. In some embodiments, the ion-implanted glass based article has a mean thickness of not more than 2 mm (e.g., not more than 0.7 mm). In some embodiments, the ions are implanted with an average depth of not more than 5 μm (e.g., not more than 4 μm, not more than 3 μm, not more than 2 μm, not more than 1 μm) under the at least one surface.

In some embodiments, the ion-implanted glass based article is further characterized by having i) the final IFT load of at least 1.25-fold (e.g., about 1.5-fold to about 10 fold) of an initial IFT load of the glass based article prior to ion-implantation, wherein the initial IFT load of the glass based article prior to ion-implantation is at least 100 grams; ii) a scratch threshold force of at least 10 N (e.g., 10 N to about 30 N); iii) a standardized 4.2 g ball drop failure height of at least 120 cm when dropped on 30 grit silicon carbide sandpaper; iv) a standardized 4.2 g inverted ball drop failure height of about 40 cm to about 50 cm when dropped on 30 grit silicon carbide sandpaper, or a combination thereof. In some embodiments, the ion-implanted glass based article is an electronic display. In some embodiments, the electronic display comprises a housing and a display, and a cover glass comprising the glass or glass ceramic substrate comprising at least one ion-implanted surface. In some embodiments, the display is provided at or adjacent to a front surface of the housing. In some embodiments, the cover glass is provided at or over the front surface of the housing and over the display.

Certain embodiments are directed to an ion-implanted glass based article characterized by its scratch threshold force. In some embodiments, the ion-implanted glass based article comprises at least one ion-implanted surface, wherein the ion-implanted glass based article is characterized by having a scratch threshold force of at least 10 N (e.g., 10N to about 30 N). In some embodiments, the at least one surface is implanted with ions such as, but not limited to, $N^+$, $Si^+$, $BF_2^+$, $P^+$, $SiF_3^+$, $N_2^+$, or a combination thereof. In some embodiments, the ions are implanted at a dose ranging from about $4 \times 10^{14}$ ions/cm$^2$ to about $2.1 \times 10^{17}$ ions/cm$^2$ (e.g., about $4 \times 10^{14}$ ions/cm$^2$ to about $5 \times 10^{15}$ ions/cm$^2$ or about $4 \times 10^{14}$ ions/cm$^2$ to about $1 \times 10^{16}$ ions/cm$^2$). In some embodiments, the ion-implanted glass based article comprises a glass or glass ceramic substrate that is not suitable for an ion-exchange process. In some embodiments, the ion-implanted glass based article comprises an ion-exchanged glass or glass ceramic substrate. In some embodiments, the ion-implanted glass based article comprises a glass or glass ceramic substrate that comprises an alkali or alkali-free glass composition, an alkaline earth boroaluminosilicate glass composition, or an alkali aluminosilicate glass composition. In some embodiments, the ion-implanted glass based article has a mean thickness of not more than 2 mm (not more than 0.7 mm). In some embodiments, the ions are implanted with an average depth of not more than 5 μm (e.g., not more than 4 μm, not more than 3 μm, not more than 2 μm, not more than 1 μm) under the at least one surface.

In some embodiments, the ion-implanted glass based article is further characterized by having i) a final IFT load of at least 1.25-fold (e.g., about 1.5-fold to about 10 fold) of an initial IFT load of the glass based article prior to ion-implantation, wherein the initial IFT load of the glass based article prior to ion-implantation is at least 100 grams; ii) a final IFT load of at least 650 grams (e.g., 650 grams to about 5000 grams); iii) a scratch threshold force of at least 10 N (e.g., 10 N to about 30 N); iv) a standardized 4.2 g ball drop failure height of at least 120 cm when dropped on 30 grit silicon carbide sandpaper; v) a standardized 4.2 g inverted ball drop failure height of about 40 cm to about 50 cm when dropped on 30 grit silicon carbide sandpaper, or a combination thereof.

Certain embodiments are directed to an ion-implanted glass based article that comprises an ion-exchanged glass or glass ceramic substrate. For example, in some embodiments, the ion-implanted glass based article comprises a glass or glass ceramic substrate and at least one ion-implanted surface, wherein the glass or glass ceramic substrate comprises an ion-exchanged glass or glass ceramic substrate. In some embodiments, the glass or glass ceramic substrate comprises a partially ion-exchanged glass or glass ceramic substrate. In some embodiments, the ion-implanted glass based article is characterized by having a final indent fracture threshold (IFT) load of at least 650 grams (e.g., about 1000 grams to about 5000 grams), a scratch threshold force of at least 10 N, or a combination thereof.

Certain embodiments are directed to an electronic device comprising the ion-implanted glass based articles described herein. For example, in some embodiments, an electronic device comprising a substantially translucent or transparent ion-implanted glass based article is provided. In some embodiments, the electronic device comprises a housing and a display. In some embodiments, the display is provided at or adjacent to a front surface of the housing. In some embodiments, the ion-implanted glass based article forms at least a portion of a cover glass provided at or over the front surface of the housing and over the display. In some embodiments, the ion-implanted glass based article comprises at least one ion-implanted surface and is characterized by having an indent fracture threshold load of about at least 650 grams (e.g., 650 grams to about 5000 grams), a scratch threshold of at least 10 N (10 N to about 30 N), or a combination thereof. Other suitable ion-implanted glass based articles are described herein.

Certain embodiments are directed to a process for preparing an ion-implanted glass based article. In some embodiments, the process comprises implanting a dose of ions under at least one surface of the glass or glass ceramic substrate. In some embodiments, the glass or glass ceramic substrate is characterized by having an initial indent fracture threshold (IFT) load of at least 100 grams. In some embodiments, the ions implanted under the at least one surface comprise ions such as $N^+$, $Si^+$, $BF_2^+$, $P^+$, $SiF_3^+$, $N_2^+$, or a combination thereof. In some embodiments, the dose of the ions implanted under the at least one surface is in the range of about $4 \times 10^{14}$ ions/cm$^2$ to about $2.1 \times 10^{17}$ ions/cm$^2$ (e.g., about $4 \times 10^{14}$ ions/cm$^2$ to about $5 \times 10^{15}$ ions/cm$^2$ or about $4 \times 10^{14}$ ions/cm$^2$ to about $1 \times 10^{16}$ ions/cm$^2$). In some embodiments, the implanting step is conducted at an implantation energy of about 45 keV to about 2000 keV. In some embodiments, the implanting step is conducted at a beam current of about 1 milliamp to about 4 milliamps. In some embodiments, the glass or glass ceramic substrate comprises an ion-exchanged glass or glass ceramic substrate (e.g., a partially ion-exchanged glass or glass ceramic substrate). In some embodiments, the glass or glass ceramic substrate is not suitable for an ion-exchange process. In some embodiments, the ions are implanted with an average depth of not more than 5 μm (e.g., not more than 4 μm, not more than 3 μm, not more than 2 μm, or not more than 1 μm) under the at least one surface.

The ion-implanted glass based article prepared by the processes described herein can be characterized by its flaw suppression properties. In some embodiments, the ion-implanted glass based article prepared by the processes described herein is characterized by having a final IFT load of at least 1.25-fold (e.g., about 1.5-fold to about 10 fold) of the IFT load of the glass or glass ceramic substrate, a scratch threshold force of at least 10 N (e.g., 10 N to about 30 N), or a combination thereof. In some embodiments, the ion-implanted glass based article prepared by the process described herein is further characterized by having i) the final IFT load of about 1.5-fold to about 10 fold of an initial IFT load of the glass based article prior to ion-implantation; ii) the final IFT load of 650 grams to about 5000 grams; iii) a scratch threshold of 10 N to about 30 N; iv) a standardized 4.2 g ball drop failure height of at least 120 cm when dropped on 30 grit silicon carbide sandpaper; v) a standardized 4.2 g inverted ball drop failure height of about 40 cm to about 50 cm when dropped on 30 grit silicon carbide sandpaper, or a combination thereof.

BRIEF DESCRIPTION OF THE FIGURES

The foregoing summary, as well as the following detailed description of the embodiments, will be better understood when read in conjunction with the appended figures. For the purpose of illustration, the figures may describe the use of specific embodiments. It should be understood, however, that the methods and compositions described herein are not limited to the precise embodiments discussed or described in the figures.

In FIG. 3B, the bars for each corresponding pair of glasses, non-ion-implanted control and ion-implanted, are shown next to each other.

FIG. 7A shows an exemplary apparatus for use in a Ball on Sandpaper ("BoS") test.

DETAILED DESCRIPTION OF THE DISCLOSURE

Definitions

Figure 1A:
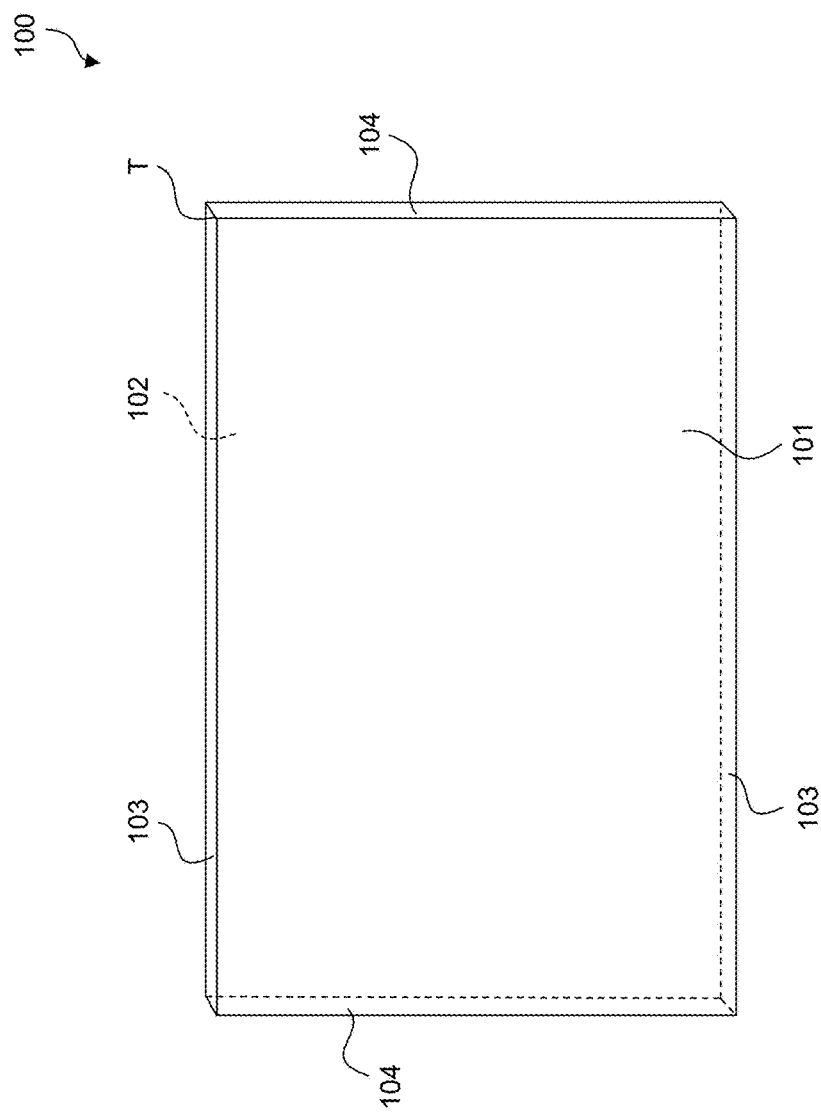
FIG. 1A shows an exemplary glass or glass ceramic substrate for ion-implantation.

Open terms such as "include," "including," "contain," "containing" and the like mean "comprising." These open-ended transitional phrases are used to introduce an open ended list of elements, method steps or the like that does not exclude additional, unrecited elements or method steps. It is understood that wherever embodiments are described with the language "comprising," otherwise analogous embodiments described in terms of "consisting of" and/or "consisting essentially of" are also provided.

The transitional phrase "consisting of" and variations thereof excludes any element, step, or ingredient not recited, except for impurities ordinarily associated therewith.

The transitional phrase "consists essentially of," or variations such as "consist essentially of" or "consisting essentially of," excludes any element, step, or ingredient not recited except for those that do not materially change the basic or novel properties of the specified method, structure or composition.

Also, the indefinite articles "a" and "an" preceding an element or component of the disclosure are intended to be nonrestrictive regarding the number of instances, i.e., occurrences of the element or component. Therefore "a" or "an" should be read to include one or at least one, and the singular word form of the element or component also includes the plural unless the number is obviously meant to be singular.

As used herein, the term "about" modifying a value related to the disclosure refers to variation in the numerical quantity that can occur, for example, through routine testing and handling; through inadvertent error in such testing and handling; through differences in the manufacture, source, or purity of ingredients employed in the disclosure; and the like. Whether or not modified by the term "about", the claims include equivalents of the recited quantities. In one embodiment, the term "about" means within 10% of the reported numerical value.

The terms "disclosure" or "present disclosure" as used herein are non-limiting terms and are not intended to refer to any single embodiment of the particular disclosure but encompass all possible embodiments as described in the application.

As used herein, the terms "glass or glass ceramic substrate", "glass or glass ceramic substrates", "glass based article", and "glass based articles" are used in their broadest sense to include any object made wholly or partly of glass. In some embodiments, the glass or glass ceramic substrate(s) and/or the glass based article(s) can have an amorphous phase and one or more crystalline phases.

Unless otherwise obvious from context, "thickness" should be understood as the average thickness. For example, a glass based article having a thickness of 1 mm should be understood as that the glass based article has an average thickness of 1 mm.

Similarly, unless otherwise obvious from context, "depth" should be understood as the average depth. For example, ions implanted not more than 1 μm under a surface should be understood that the average depth of the ions implanted is not more than 1 μm under the surface.

As understood by those skilled in the art, the unit of "micron" or "μm" used herein refers to a micrometer, i.e., $1 \times 10^{-6}$ of a meter.

Ion Implantation Process

When a glass based article's thickness drops below 1 mm, for example, not more than 700 microns, or not more than 500 microns, non-stress-based treatments are competitive with or superior to stress-based treatments such as an ion-exchange treatment.

Ion implantation appears not to create or trap significant stress for glassed based articles. Ion implantation includes processes such as ion shower, plasma immersion ion implantation, with or without a momentum analyzer. Without wishing to be bound by theories, it is believed that ion implantation transforms the near surface of the glass based article so that the surface becomes more micro-ductile. The micro-ductility suppresses flaw formation without the use of internal stress. Glass thickness has no relation to the efficacy of the implant treatment.

One of the major differences between ion implantation and other treatments such as ion exchange or thermal tempering is the amount of trapped stress in the glass. As shown herein, ion implantation does not trap significant stress in the glass. Glass wafers (0.7 mm or 0.55 mm thick) implanted on one side only did not bow significantly after implantation, thus inferring low stress from the implant. The ions are generally implanted with an average depth of not more than 5 μm (e.g., not more than 4 μm, not more than 3 μm, not more than 2 μm, or not more than 1 μm) under the surface. In another experiment, glass wafers were partially masked prior to implantation. No stress could be detected at the junction between the implanted and non-implanted regions using a polariscope.

For glasses above 500 microns thickness, ion exchange is typically employed to enhance resistance to fracture. Since the ion exchange uses trapped stress as the mechanism to reduce fracture, there is significant trapped tension in the interior glass to balance the compression stress at the near surface. As glass gets thinner, there is less interior glass to bear the tension, thus the ion exchange treatment must be reduced. In contrast, ion implantation suppresses flaw creation without stress. Thickness of the glass and IFT enhancement from ion implantation seem to have no relation to one another.

Turning now to the figures. A glass or glass ceramic substrate 100 for an exemplary process is shown in FIG. 1A. The glass or glass ceramic substrate 100 has a first and second opposing surfaces 101 and 102, and a plurality of edge surfaces such as 103 and 104 extending transversely between the first and second opposing surfaces. For maximum benefit, the glass surface should be as flaw free as possible before ion-implantation treatment. The glass or glass ceramic substrate 100 may be cut from a glass wafer, a glass ribbon or other such glass member. While the glass or glass ceramic substrate 100 shown in FIG. 1A is a rectangular shape, it is understood by those skilled in the art that suitable glass or glass ceramic substrates may take any suitable geometric shape and may be created for any suitable purpose. In one embodiment, for example, the glass or glass ceramic substrate can generally have a rectangular shape and can be configured, for example, to serve as a cover glass in an electronic device (e.g., a consumer electronic device). In other embodiments, the glass or glass ceramic substrate can have a circular shape and can be configured, for example, to serve as a cover glass for a camera or watch.

The glass or glass ceramic substrates can have various thickness, which is expressed as "T" in FIG. 1A for the exemplary glass or glass ceramic substrate 100. In some embodiments, the glass or glass ceramic substrate is largely planar, for example, with a mean thickness of not more than 2 mm. In some embodiments, the glass or glass ceramic substrate can have a 3-D structure. In some embodiments, the glass or glass ceramic substrate has a mean thickness of not more than 2 mm, (e.g., not more than 1 mm, not more than 0.7 mm, not more than 0.6 mm, not more than 0.5 mm, not more than 0.4 mm, not more than 0.3 mm, not more than 0.2 mm, not more than 0.1 mm, not more than 0.05 mm, or not more than 0.01 mm). For example, the glass or glass ceramic substrate can have a mean thickness of about 2 mm, about 1 mm, about 0.7 mm, about 0.6 mm, about 0.5 mm, about 0.4 mm, about 0.3 mm, about 0.2 mm, about 0.1 mm, about 0.05 mm, about 0.01 mm, or any ranges between the specified values. While the advantages described herein are more pronounced in thin-glass applications, in some embodiments, the ion implantation process described herein can also be used for thicker glasses. In some embodiments, the glass or glass ceramic substrate can also have a mean thickness of at least 0.7 mm (e.g., at least 1 mm, at least 10 mm, at least 100 mm, or at least 1000 mm).

Figure 1B:
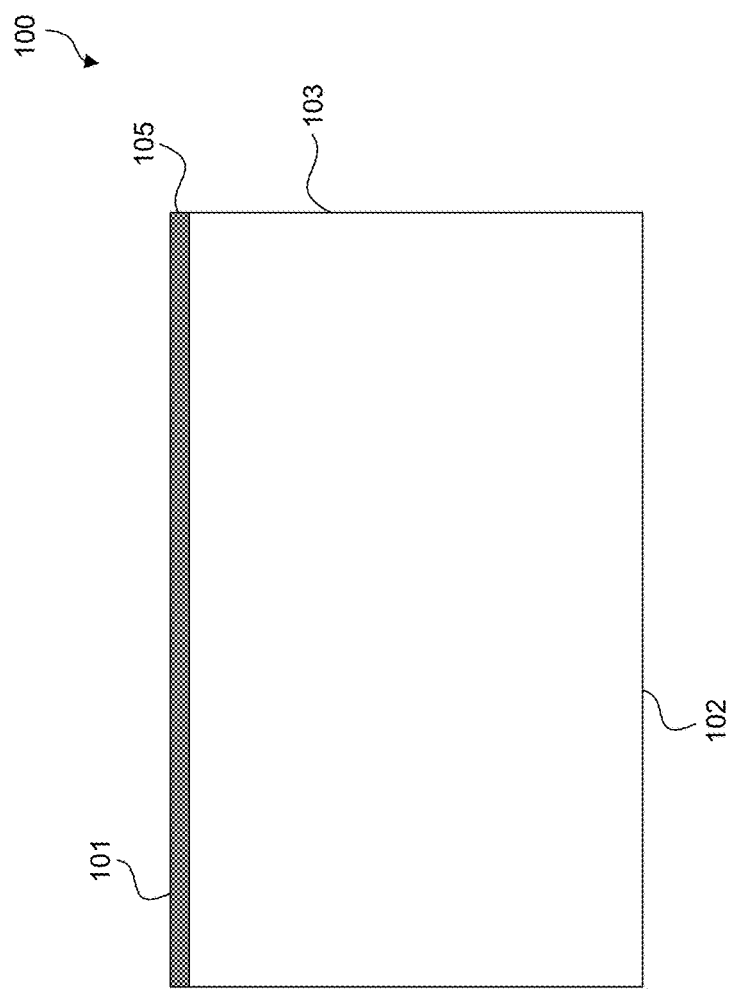
FIG. 1B presents a cross section schematic view of a glass or glass ceramic substrate with an ion-implanted surface.

Shown in FIG. 1B is a cross-sectional schematic view of an exemplary ion implanted glass based article from glass or glass ceramic substrate 100. In FIG. 1B, only one surface 101 of the glass or glass ceramic substrate is ion-implanted. Ion-implantation of surface 101 creates a "layer" 105 which has ions such as, but not limited to $N^+$, $Si^+$, $BF_2^+$, $P^+$, $SiF_3^+$, or $N_2^+$ implanted. Generally, the average depth of ions implanted in this layer 105 is not more than 5 μm (e.g., not more than 4 μm, not more than 3 μm, not more than 2 μm, or not more than 1 μm) under the surface 101. In some embodiments, the average depth of ions implanted in this layer 105 is not more than 1 μm (e.g., not more than 0.5 μm, not more than 0.2 μm, or not more than 0.1 μm) under the surface 101. In some embodiments, the average depth of ions implanted in the layer 105 is about 1 μm, about 0.8 μm, about 0.5 μm, about 0.2 μm, about 0.1 μm, or any ranges between the specified values, under the surface 101. While not wishing to be bound by theories, it is believed that this layer 105 helps the surface become more micro-ductile, which can suppress flaw formation without the use of internal stress.

Layer 105 can have but does not require a homogenous or substantially homogenous distribution of implanted ions across different areas of the surface. Variations in ion concentrations within layer 105 are generally allowed. For example, ions can be implanted under surface 101 with a concentration gradient. In some embodiments, a surface, such as the first surface 101 of the glass or glass ceramic substrate may have an implanted ion concentration gradient with regions having different concentrations of ions and/or different types of ions. For example, the region of the first surface 101 which is near the peripheral edge 103 may have a higher concentration of ions than and/or a different type of implanted ions from the center of the first surface. Additionally, or alternatively, the region of the first surface 101 which is near the edge 104 may have a higher concentration of ions than and/or a different type of implanted ions from the center of the first surface. For example, the peripheral edges may be implanted with $N^+$ ions and/or $Si^+$ ions, while the center may be implanted with $P^+$ ions.

In some embodiments, the implanted ions are homogenously or substantially homogenously distributed in layer 105. For example, a sheet of glass or glass ceramic substrate can be ion-implanted and then cut and edged according to various needs, which typically could result in ions being homogenously or substantially homogenously distributed among center and edges of the glass or glass ceramic substrate after cutting and edging. Cutting and edging the glass based articles after ion implantation can be done using conventional methods since the glass is not under significant stress after the ion implantation treatment.

More than one surface of the glass or glass ceramic substrate 100 can be implanted with ions. Any of the first and second opposing surfaces 101 and 102 and the edge surfaces 103 and 104 of the glass or glass ceramic substrate 100 can be ion-implanted. For example, in some embodiments, one of the first and second opposing surfaces 101 and 102 is ion-implanted and the other of the first and second opposing surfaces 101 and 102 is not ion-implanted. In some embodiments, both the first and second opposing surfaces 101 and 102 are ion-implanted. In some embodiments, one of the first and second opposing surfaces 101 and 102 of the glass or glass ceramic substrate is ion-implanted but the remaining surfaces are not ion-implanted. In other words, only one surface of the glass or glass ceramic substrate is ion-implanted as shown in FIG. 1B. In some embodiments, both the first and second opposing surfaces 101 and 102 of the glass or glass ceramic substrate can be ion-implanted but the remaining surfaces are not ion-implanted. In some embodiments, one of the first and second opposing surfaces 101 and 102 of the glass or glass ceramic substrate is ion-implanted and at least one of the edge surfaces, e.g., 103 and 104, are also ion-implanted. In some embodiments, both the first and second opposing surfaces 101 and 102 of the glass or glass ceramic substrate are ion-implanted and at least one of the edge surfaces, e.g., 103 and 104, are also ion-implanted. In some embodiments, the edge surfaces, e.g., 103 and 104, are not ion-implanted. In some embodiments, one or more of the edge surfaces are also ion-implanted. In some embodiments, all of the surfaces are ion-implanted.

When more than one surfaces are implanted with ions, the types of ions and concentrations of ions can be different under the same surface or different surfaces. For example, the first surface 101 may be implanted with a different concentration of ions than and/or different ions from the edge surfaces 103 and 104. Further, each of the edge surfaces 103 and 104 may have a different concentration of ions and/or different ions.

Suitable ion implantation processes include any of those known in the art, such as ion shower, plasma immersion ion implantation, with or without a momentum analyzer. Typically, the ion implantation process involves directing a surface of the glass or glass ceramic substrate 100 (e.g., the first or second opposing surface) towards an ion implantation device such that the surface can receive ions from the ion implantation device. In some embodiments, for glass or glass ceramic substrate that has a 3-dimensional structure, plasma immersion ion implantation is used. While not wishing to be bound by theories, plasma immersion ion implantation processes can accommodate a 3-dimensional substrate easier when compared to using ion shower ion implantation. Various ion implantation devices are known in the art and can be used in embodiments disclosed herein.

Figure 2:
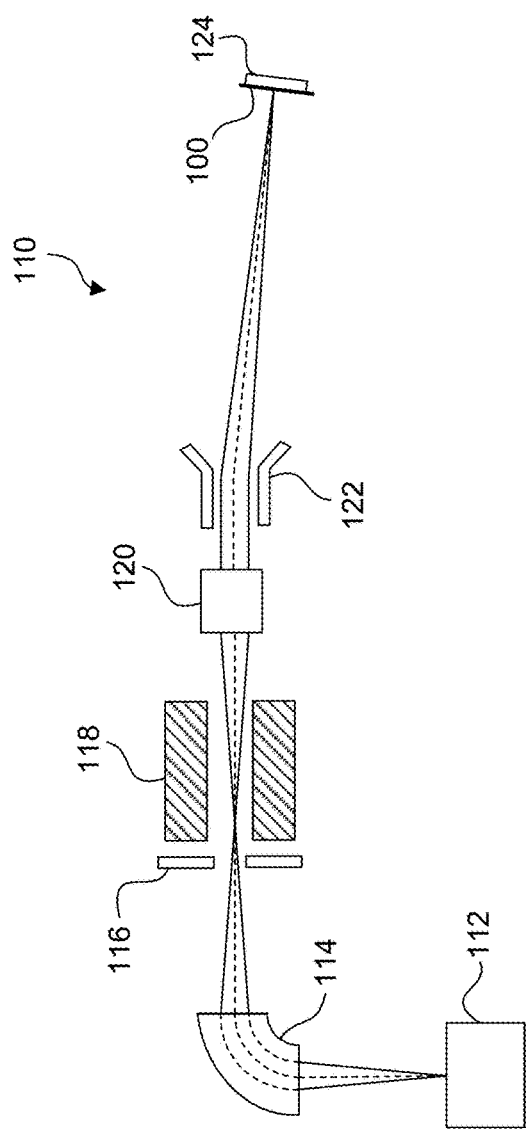
FIG. 2 shows an exemplary ion-implantation system suitable for use to implant ions under the at least one surface of a glass or glass ceramic substrate.

FIG. 2 shows an exemplary ion-implantation system. The implantation system 110 can be operated according to conventional techniques. Initially, the glass or glass ceramic substrate 100 can be positioned in an end station 124 so that ions may be directed at and implanted in the glass or glass ceramic substrate 100. The ions for implantation start at an ion source 112. An element/molecule such as silicon, nitrogen, $BF_3$, $SiF_4$, P, $N_2$, or another element/molecule can be converted into ion plasma for use as an ion source. The ions are then redirected by an analyzer magnet 114 and filtered or separated by a variable slit 116. The ions are subsequently passed through an ion acceleration column 118. The ions are then passed through an electronic scanning system or unit comprising a vertical scanner 120 and a horizontal scanner 122 before impacting the glass or glass ceramic substrate 100. Other ion-implantation systems, such as plasma immersion ion-implantation systems are known in the art and can be used in embodiments described herein.

The ion-implantation treatment, under suitable conditions, transforms the glass so that the implanted surface suppresses flaw formation, e.g., increases the indent fracture threshold (IFT) of the glass and/or scratch threshold force. In addition to the improved flaw suppression, ion-implantation treatment described herein is also associated with various other advantages. For example, glass based articles with ion implantation can be manufactured economically. In some embodiments, the ion implantation step can be incorporated into continuous ribbon processes or roll-to-roll processes in manufacturing glass based articles. Ion implantation is also a cleaner process when compared to conventional ion exchange. Generally, the implantation process does not create waste. Implantation processing time can also be significantly reduced compare to conventional ion exchange process. Also, ion implanted glass based articles described herein showed minimal amount optical distortion and minimal loss of transparency.

Unless otherwise specified or obvious from context, the flaw suppression properties of the ion-implanted glass articles as described herein, such as the final IFT load, the scratch threshold force, the failure resistance as measured by the BoS or IBoS test, refer to the properties measured for the at least one ion-implanted surface. Flaw suppression properties measured for the non-ion-implanted surface(s) could reflect the corresponding properties of the starting glass or glass ceramic substrate prior to ion-implantation, assuming the surfaces of the starting glass or glass ceramic substrate prior to ion-implantation have substantially the same properties. For example, in some embodiments, the IFT load determined for the non-ion-implanted surface(s) of the ion-implanted glass based article can reflect the initial IFT load of the glass or glass ceramic substrate prior to ion-implantation.

IFT Load

Ion-implantation treatment described herein increases the indent fracture threshold (IFT) load of the glass based article. Indentation fracture threshold is a measure of indentation damage resistance of the glass based article. IFT load is the threshold load for the initiation of strength controlling flaws (radial cracks) from the indent impression and it is a measure of a glass's resistance to crack initiation. For example, the ion-implanted glass based article described herein can be characterized by having a final indent fracture threshold (IFT) load of at least 650 grams (e.g., at least 700 grams, at least 800 grams, at least 1000 grams, at least 1200 grams, at least 1600 grams, at least 2000 grams, at least 2400 grams, at least 2800 grams, at least 3200 grams, at least 3600 grams, at least 4000 grams, or at least 5000 grams). In some embodiments, the ion-implanted glass based article is characterized by having a final IFT load of about 650 grams, about 700 grams, about 800 grams, about 1000 grams, about 1200 grams, about 1600 grams, about 2000 grams, about 2400 grams, about 2800 grams, about 3200 grams, about 3600 grams, about 4000 grams, about 5000 grams, or any ranges between the specified values.

Factors affecting the efficacy of ion implantation include the IFT load of the starting glass or glass ceramic substrate (native IFT load), ion type, ion dose, implant energy, beam current, and glass temperature.

Native IFT Load

The glass based article's native (i.e., prior to the ion-implantation process described herein) flaw suppression properties are a determinant of the final flaw suppression properties of the ion implanted glass based article. For example, starting with a high native IFT glass or glass ceramic substrate can lead to the best flaw suppression properties from the final article after ion implantation.

The ion implantation treatment described herein can enhance the glass based article's IFT load in proportion to the glass based article's native IFT load, i.e., prior to ion implantation. Typically, the ion-implanted glass based article has a final IFT load of at least 1.25-fold (e.g., at least 1.5-fold, at least 2-fold, at least 4-fold, at least 6-fold, at least 8-fold, or at least 10-fold) of an initial IFT load of the glass based article prior to ion-implantation. In some embodiments, the ion-implanted glass based article has a final IFT load of about 1.5-fold, about 2-fold, about 4-fold, about 6-fold, about 10-fold, or any ranges between the specified values, of the initial IFT load of the glass based article prior to ion-implantation. The higher the glass based article's native IFT load, the higher the final IFT load can be obtained for the ion-implanted glass based article.

The load at 50% crack formation (being defined here as the Indentation Fracture Threshold load) as described herein is measured by a Vickers indenter. Indentation fracture threshold is a measure of indentation damage resistance of the glass. The test involves the use of a square-based pyramidal diamond indenter with an angle of 136° between faces, referred to as a Vickers indenter. The Vickers indenter is same as the one used in standard micro hardness testing (reference ASTM-E384-11). For each specimen, multiple sets of five indentations are introduced to the specimen surface. Each set of five indentations is introduced at a different load, but all five indentations of the same set are made at the same load, with each individual indentation separated by a minimum of 5 mm and no closer than 5 mm to a specimen edge. A rate of indenter loading/unloading of 50 kg/minute is used for test loads≥2 kg. For test loads<2 kg, a rate of 5 kg/minute shall be used. A dwell (i.e., hold) time of 10 seconds at the target load is utilized. The machine maintains load control during the dwell period. The target load is then removed after the dwell period. After a period of at least 12 hours, the indentations are inspected under reflected light using a compound microscope at 500× magnification, or high enough to allow a detailed inspection of the indentation. The number of median/radial cracks around the corners of each indentation are then counted (the maximum number of these cracks around a single indentation can be four, allowing one for each indentation corner), and then expressed as a percentage of the total indentation corners. For example, with five indentations there are a total of twenty indentation corners. If ten of the indentation corners formed median/radial crack, then that load would be the IFT for the glass, since 50% of the indentation corners formed median/radial cracks. Note that the formation of lateral cracks is not considered indicative of exhibiting threshold behavior, since this test is concerned with the formation of median/radial cracks. The pre-test, test and post-test environment should ideally be controlled to 23±2° C. and 50±5% RH to minimize variation in the fatigue (stress corrosion) behavior of the glass specimens. It should be noted that when first testing an unfamiliar composition or pedigree, the required indentation loads and bracketing increment must often be determined by performing an "iterative search." Once familiarity with the sample's performance is gained, future testing may be streamlined by testing only those loads near the expected threshold, and then "filling in" additional indentation loads only if necessary.

Figure 3A:
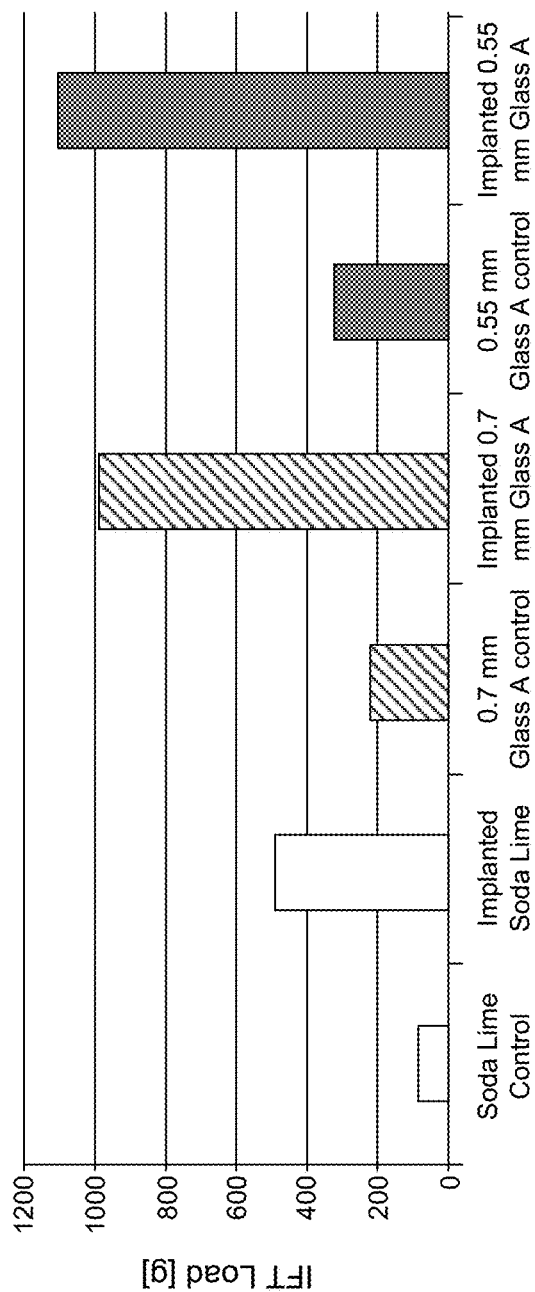
FIG. 3A presents a bar graph comparing Indent Fracture Threshold (IFT) loads of various glasses in their native state (i.e. non-ion-implanted), as control glasses, with the IFT loads observed for the corresponding glasses after ion-implantation.
Figure 3B:
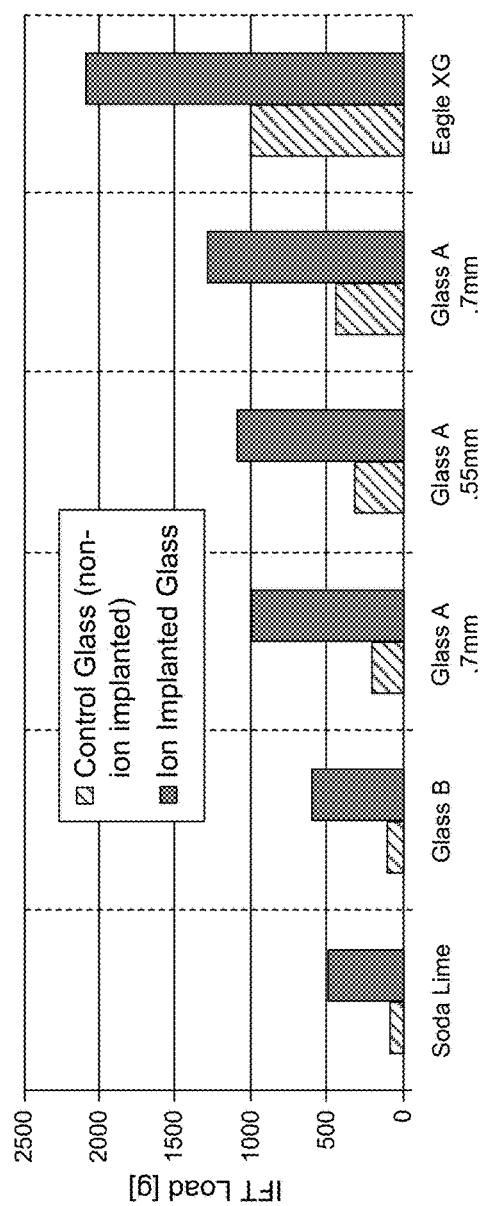
FIG. 3B presents a further bar graph comparing IFT loads of various glasses in their native state (i.e. non-implanted), as control glasses, with the IFT loads observed for the corresponding glasses after ion-implantation.

Examples of observed enhancements of IFT loads following ion-implantation are shown in FIGS. 3A and 3B. FIG. 3A compares the IFT loads of various glasses in their native state (i.e. non-ion-implanted), as control glasses, with the IFT loads observed for the corresponding glasses after ion-implantation (treated on one side only). As shown in FIG. 3A, the IFT loads of both soda-lime glass and alkali aluminosilicate glass A ("referred to a glass A" throughout) having a composition on a mol % oxide basis of 69.2 mol % $SiO_2$, 8.5 mol % $Al_2O_3$, 13.9 mol % $Na_2O$, 1.2 mol % $K_2O$, 6.5 mol % MgO, 0.5 mol % CaO, 0.2 mol % $SnO_2$ were improved by 2× or more after implanted with $N^+$ when tested at 0.55 mm and 0.7 mm thickness. For example, ion-implanted glass A (with 0.7 mm thickness) has an IFT load of about 1000 grams, compared to the native IFT load of about 200 grams, i.e., a near 5-fold enhancement. Similarly, ion-implanted glass A (with 0.55 mm thickness) has an IFT load of about 1100 grams, compared to the native IFT load of about 320 grams, i.e., a greater than 3-fold enhancement. The same trend was also observed for other types of glasses. As shown in FIG. 3B, a comparison of IFT loads of various glasses in their native state (i.e. non-implanted), as control glasses, with the IFT loads observed for the corresponding glasses after ion-implantation with $N^+$, shows that the higher the IFT of the native glass, the higher the IFT of the ion implanted glass. For example, ion-implanted Eagle XG® glass based article has the highest IFT load (about 2100 grams) after ion-implantation, as Eagle XG® glass has the highest native IFT load of about 1000 gram among the tested glass based articles. Also shown in FIGS. 3A and 3B, native glass A has a higher IFT than native soda-lime glass. After treatment, the final IFT of glass A is much higher than the ion-implanted soda lime. Similarly, FIG. 3B shows that native glass B has a higher IFT than native soda-lime glass. After treatment, the final IFT of glass B is also higher than the ion-implanted soda lime. Glass B used for FIG. 3B is an alkaline-earth aluminoborosilicate glass, with a general composition on a wt % oxide basis shown in table 1 below:

TABLE 1

| Composition of Glass B | |
|---|---|
| Oxide | wt % |
| Silica | 61 |
| Alumina | 18 |
| Barium oxide | 8.3 |
| Calcia | 4.3 |
| Magnesia | 3 |
| Strontium oxide | 2.1 |
| Antimony Oxide | 1.75 |
| Boron oxide | 1.25 |
| Other | balance |

Thus, in preferred embodiments, the ion-implantation processes described herein starts with glass or glass ceramic substrate having a high initial IFT load prior to ion-implantation, e.g., at least 100 grams (e.g., at least 150 grams, at least 200 grams, at least 400 grams, at least 600 grams, at least 800 grams, at least 1000 grams, or at least 3000 grams). In some embodiments, the initial IFT load prior to ion-implantation is about 100 grams, about 150 grams, about 200 grams, about 400 grams, about 600 grams, about 800 grams, about 1000 grams, about 3000 grams, or any ranges between the specified values.

Various types of glass compositions can form the glass or glass ceramic substrate of the ion-implanted glass based article. Glass or glass ceramic substrates that are not suitable for an ion-exchange process can also be treated with ion-implantation. For example, the glass or glass ceramic substrate may not contain ions (e.g., alkali ions such as $Li^+$, $Na^+$, $K^+$, etc.) that can be exchanged in a typical ion-exchange process (e.g., a process using molten nitrates). In other embodiments, the glass or glass ceramic substrate may be too thin (e.g., not more than 500 um) such that an ion exchange treatment (even a partial ion-exchange process) leads to the breakage of the substrate. However, in some embodiments, glass or glass ceramic substrates that are ion-exchanged can also be treated with ion-implantation. In some embodiments, the ion-implanted glass based article comprises a glass or glass ceramic substrate that is an alkali-free glass, an alkali glass, an alkaline earth boroaluminosilicate glass (e.g., Corning Eagle XG®), an alkali aluminosilicate glass (e.g., glass A), or an alkali aluminoborosilicate glass (e.g., glass C). In some embodiments, the glass or glass ceramic substrate is an alkaline earth boroaluminosilicate glass. In some embodiments, the glass or glass ceramic substrate is an alkali aluminoborosilicate glass. In some embodiments, the glass or glass ceramic substrate is an alkali aluminosilicate glass comprising about 61 mol % to about 75 mol % $SiO_2$; about 7 mol % to about 15 mol % $Al_2O_3$; 0 mol % to about 12 mol % $B_2O_3$; about 9 mol % to about 21 mol % $Na_2O$; 0 mol % to about 4 mol % $K_2O$; 0 mol % to about 7 mol % MgO; and 0 mol % to about 3 mol % CaO. In some embodiments, the glass or glass ceramic substrate is an alkali aluminosilicate glass comprising (in mol %) 69.49% $SiO_2$, 8.45% $Al_2O_3$, 14.01% $Na_2O$, 1.16% $K_2O$, 0.185% $SnO_2$, 0.507% CaO, 6.2% MgO, 0.01% $ZrO_2$, and 0.008% $Fe_2O_3$. In some embodiments, the glass or glass ceramic substrate is not a soda-lime glass. Other suitable glasses are known in the art and can be used in embodiments described herein.

In some embodiments, the combination of an ion-exchange process and an ion-implantation process can be advantageous. The mechanisms of reducing fracture for ion-exchange process and ion-implantation can complement each other to obtain further enhanced resistance to cracking. Ion-exchange processes are known to enhance resistance to fractures, which use trapped stress as a mechanism to reduce fracture and there is significant trapped tension in the interior glass to balance the compression stress at the near surface. In contrast, ion implantation suppresses flaw creation without stress. While not wishing to be bound by theories, it is believed that the compressive stress on the near surface of the ion-exchanged glass can help preventing further extension of an initial crack on the near surface. On the other hand, it is believed that ion implantation transforms the near surface of the glass based article so that the surface becomes more micro-ductile, which suppresses flaw formation without the use of internal stress. Thus, in some embodiments, the glass or glass ceramic substrate can also be an ion-exchanged glass. For example, the glass or glass ceramic substrate can be a partially ion-exchanged glass, for example, when the glass or glass ceramic substrate is a thin glass with a thickness of not more than 2000 micron (e.g., not more than 1000 micron, or not more than 500 micron). Ion-exchanged glasses are known in the art and can be used in embodiments described herein.

Ions and Doses

Various ions can be implanted to form the ion-implanted articles as described herein. In some embodiments, the glass based article is implanted with $N^+$, $Si^+$, $BF_2^+$, $P^+$, $SiF_3^+$, $N_2^+$, or any combination thereof. In some embodiments, the glass based article is implanted with $N^+$. In some embodiments, the glass based article is implanted with $SiF_3^+$. In some embodiments, the glass based article is implanted with $Si^+$. In some embodiments, the glass based article is implanted with $BF_2^+$. In some embodiments, the glass based article is implanted with $P^+$. In some embodiments, the glass based article is not implanted with $N^+$. In some embodiments, the glass based article is not implanted with $SiF_3^+$. In some embodiments, the glass based article is not implanted with $Si^+$. In some embodiments, the glass based article is not implanted with $BF_2^+$. In some embodiments, the glass based article is not implanted with $P^+$. in some embodiments, the glass based article is not implanted with one or both of $SiF_3^+$ and $N_2^+$. Other ions suitable for use in ion-implantation processes such as $Al^+$, $O^+$, $C^+$, $Ge^+$, $Ga^+$, $As^+$, $H^+$, $He^+$, $B^+$, and $Ar^+$ are known in the art and can also be implanted in the glass based article of embodiments described herein. However, in some embodiments, the glass based article is not implanted with one or more of $H^+$, $He^+$, and $Ar^+$. In some embodiments, negative or positive ions, bis-charged or multi-charged ions such as $Al^-$, $O^-$, $C^-$, $Ge^-$, $Ga^-$, $As^-$, $F^-$, $Cl^-$, $B^{3+}$, $Al^{3+}$, can also be used. In some embodiments, however, the ions implanted are monovalent positively charged ions.

Figure 4:
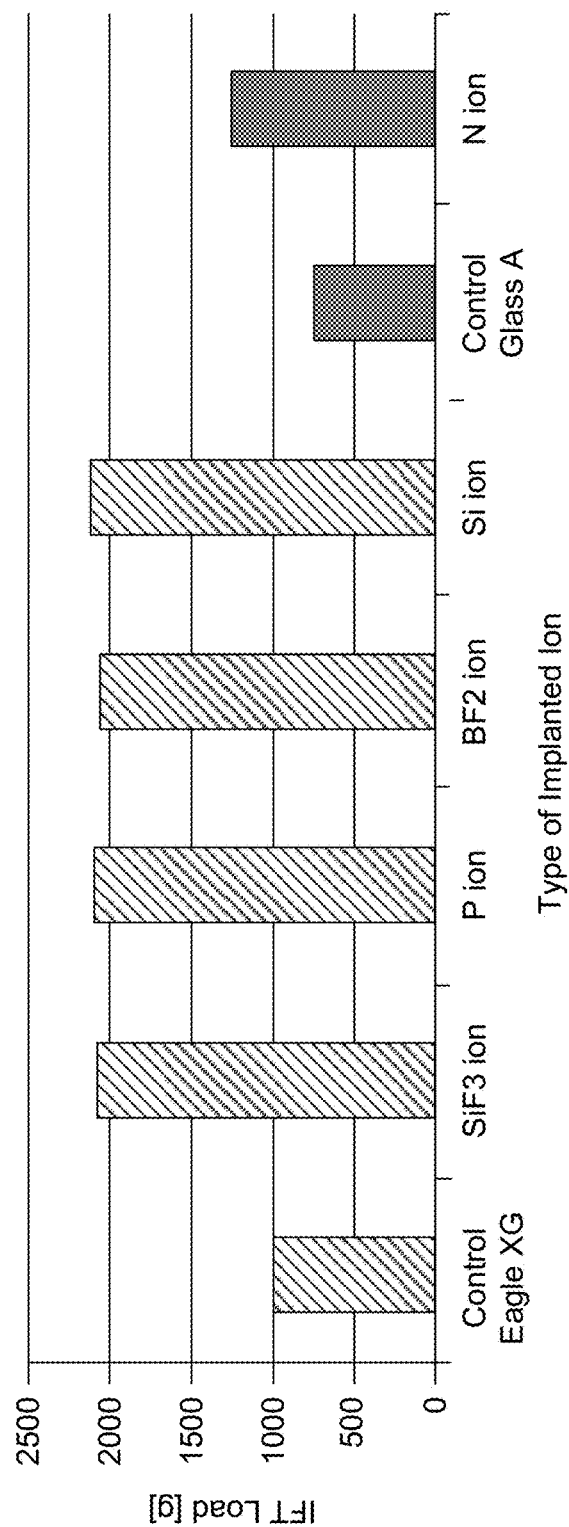
FIG. 4 presents a bar graph comparing the IFT loads of Eagle XG® glass and glass A in their native state (i.e. non-ion-implanted), as control glasses, with the IFT loads observed for the corresponding glasses after implantation with various ions. Solid shaded bars denote glass A. Dashed bars denote Eagle XG® glasses.

The effect of different types of ions on the final IFT load is illustrated in FIG. 4. As shown in FIG. 4, various ions can be implanted to enhance the final IFT. Specifically, Eagle XG® glasses implanted with $Si^+$, $BF_2^+$, $P^+$, or $SiF_3^+$ all achieved a final IFT load of about 2000 grams, which is similar to the observed final IFT load for $N^+$ implanted Eagle XG® glass (see FIG. 3B).

One or more types of ions can be implanted under the at least one surface of the glass based article. In some embodiments, a single type of ion is implanted under the at least one surface of the glass based article. In some embodiments, a combination of two or more different ions are implanted under the at least one surface of the glass based article. For example, in some embodiments, a first surface of the glass based article is implanted with one type of ions and a second surface of the glass based article (e.g., an edge surface or the opposite surface of the first surface) is implanted with a different type of ions. In some embodiments, a combination of two or more different ions are implanted under the same surface of the glass based article.

Various doses of ions can be implanted under the at least one surface of the glass based article. In some embodiments, the dose ranges from about $4 \times 10^{14}$ ions/$cm^2$ to about $2.1 \times 10^{17}$ ions/$cm^2$. For example, the dose can be about $4 \times 10^{14}$ ions/$cm^2$, about $5 \times 10^{15}$ ions/$cm^2$, about $1 \times 10^{16}$ ions/$cm^2$, about $2 \times 10^{16}$ ions/$cm^2$, about $3 \times 10^{16}$ ions/$cm^2$, about $4 \times 10^{16}$ ions/$cm^2$, about $5 \times 10^{16}$ ions/$cm^2$, about $6 \times 10^{16}$ ions/$cm^2$, about $7 \times 10^{16}$ ions/$cm^2$ about $8 \times 10^{16}$ ions/$cm^2$, about $9 \times 10^{16}$ ions/$cm^2$, about $1 \times 10^{17}$ ions/$cm^2$, about $2.1 \times 10^{17}$ ions/$cm^2$, or any ranges between the specified values.

Figure 5:
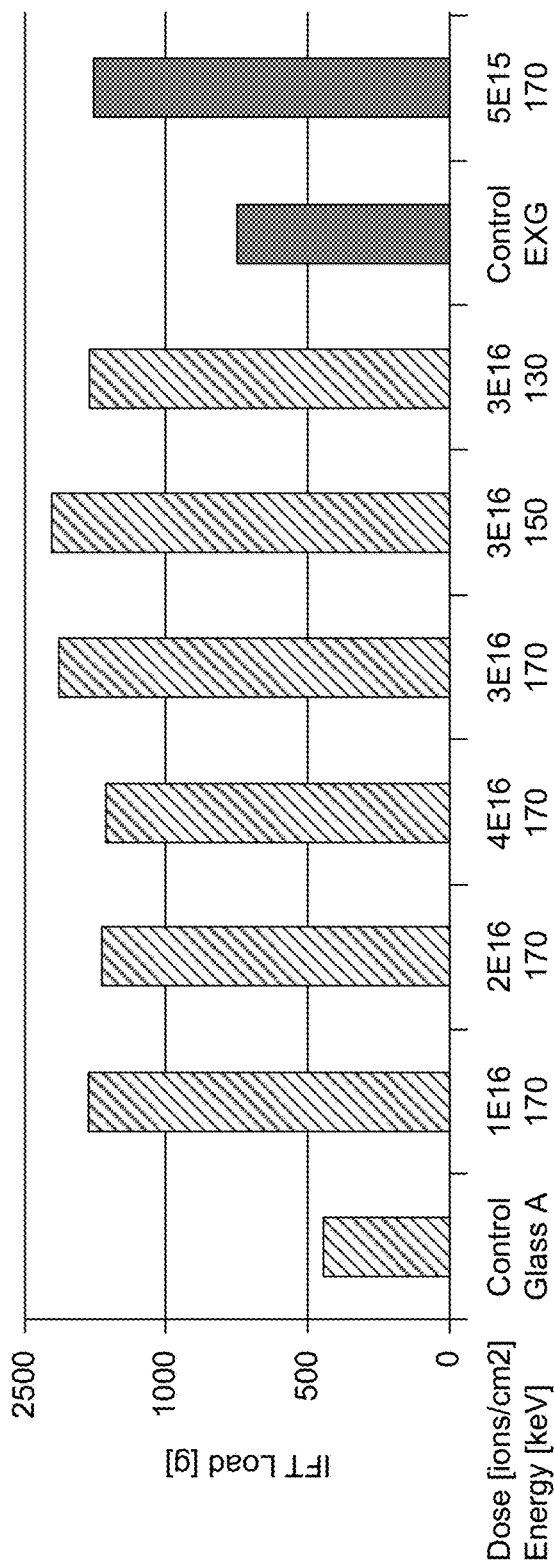
FIG. 5 presents a bar graph comparing the IFT loads of glass A and Eagle XG® glass in their native state (i.e. non-ion-implanted), as control glasses, with the IFT loads observed for the corresponding glasses after implantation with $N^+$ at various energies and doses. Solid shaded bars denote Eagle XG® glasses. Dashed bars denote glass A.

The effect of ion doses on the final IFT loads is illustrated in FIG. 5. Compared to non-ion-implanted glass A samples, the IFT loads of the $N^+$ ion implanted glass A samples are generally at least two-fold higher across the ion doses from $1 \times 10^{16}$ ions/$cm^2$ to $4 \times 10^{16}$ ions/$cm^2$. Further, even with an ion dose of $5 \times 10^{15}$ ions/$cm^2$, the IFT load of the $N^+$ ion implanted Corning Eagle XG® glass is about 1200 grams, a significant improvement over the native IFT (i.e., prior to ion-implantation) of about 750 grams. Thus, FIG. 5 shows that the lowest dose tested at about $5 \times 10^{15}$ ions/$cm^2$ produced the full flaw suppression effect. As ion doses and the cost of ion-implantation are directly related, the low doses of ions such as about $4 \times 10^{14}$ ions/$cm^2$ or about $5 \times 10^{15}$ ions/$cm^2$, which provides flaw suppression effects, can be advantageous. In some embodiments, the dose can also be from about $4 \times 10^{14}$ ions/$cm^2$ and up to about $1 \times 10^{16}$ ions/$cm^2$, for example, from about $4 \times 10^{14}$ ions/$cm^2$ to about $1 \times 10^{16}$ ions/$cm^2$, from about $4 \times 10^{14}$ ions/$cm^2$ to about $5 \times 10^{15}$ ions/$cm^2$, or from about $5 \times 10^{15}$ ions/$cm^2$ to about $1 \times 10^{16}$ ions/$cm^2$.

As understood by those skilled in the art, the total dose of ions implanted relates to the beam current by the following equation and therefore can be controlled:

$$Q=It/ZeA,$$

where Q is total implant dose; I is beam current (amps), t is implant time to scan area (sec), Z is the charges on the ion, e is electron charge, which is $1.6 \times 10^{-19}$ C, and A is area (cm$^2$).

For the processes described herein, the beam current typically ranges from about 1 milliamp to about 4 milliamps (e.g., about 1.5 milliamps, about 2 milliamps, about 2.5 milliamps, about 3 milliamps, about 3.5 milliamps, about 4 milliamps, or any ranges between the specified values). The inventors have found that all beam currents tested (about 1 milliamp to about 4 milliamps) produced the enhanced IFT load and flaw suppression effect. Higher beam currents are favored because they generally enable faster, more economical, ion-implantation treatment.

The implant energies used for the process described herein typically range from about 45 keV to about 2000 keV. In some embodiments, the implant energy ranges from about 45 keV to about 200 keV (e.g., about 50 keV, about 70 keV, about 90 keV, about 110 keV, about 130 keV, about 150 keV, about 170 keV, about 190 keV, about 200 keV, or any ranges between the specified values). In some embodiments, the implant energy is at least 200 keV (e.g., about 250 keV, about 300 keV, about 400 keV, about 500 keV, about 750 keV, about 1000 keV, about 1500 keV, about 2000 keV, or any ranges between the specified values). In some embodiments, the implant energy is from about 45 keV up to the maximum energy suitable for the ion-implantation device. However, lower implant energies may be used in some embodiments. For example, in certain embodiments, the implant energies can also be less than 45 keV, for example, about 20 keV. At implant energy level lower than 45 keV, the enhancement of the IFT load of the treated glass may be reduced. The effect of different implant energy on final IFT load is shown in FIG. 5. As shown in FIG. 5, glass A samples implanted with N$^+$ at a dose of $3 \times 10^{16}$ ions/cm$^2$ showed about the same final IFT load with the implantation energy ranging from 130 keV to 170 keV.

Typically, the ions (e.g., as described herein) are implanted under the near surface of the glass based article, for example, with an average depth of not more than 5 μm (e.g., not more than 4 μm, not more than 3 μm, not more than 2 μm, or not more than 1 μm) under the at least one surface. In some embodiments, the ions are implanted under the near surface of the glass based article with an average depth of not more than 1 μm (e.g., not more than 0.5 μm, not more than 0.2 μm, or not more than 0.1 μm) under the at least one surface. See also FIG. 1B. In some embodiments, the ions implanted can reach an average depth of about 1 μm, about 0.8 μm, about 0.5 μm, about 0.2 μm, about 0.1 μm, or any ranges between the specified values, under the at least one surface. In some embodiments, where two or more surfaces of the glass based article are ion-implanted, the ions can be implanted under the surfaces reaching the same or different average depth.

Glass annealing temperature can affect the IFT load of ion implanted glass based articles. Ion-implanted glass based articles with enhanced IFT load returned to their native (non-implanted) IFT values after annealing the glass at 500° C. for 2 hours. In some embodiments, the ion-implanted glass based articles are not annealed. In some embodiments, where ion-exchange is used in combination with ion-implantation, the ion-exchange step, which typically involves a temperature of about 300° C. to about 600° C., is performed prior to the ion-implantation step. For example, an ion-exchanged (e.g., partially exchanged) glass can be used as a glass or glass ceramic substrate for ion-implantation as described herein.

Scratch Threshold Force

The ion-implantation treatment can also enhance the scratch threshold force of the glass based articles. For example, the ion-implanted glass based article described herein can be characterized by having a scratch threshold force of at least 10 N (e.g., at least 12 N, at least 14 N, at least 16 N, at least 18 N, at least 20 N, at least 22 N, at least 24 N, at least 26 N, at least 28 N, or at least 30 N). In some embodiments, the ion-implanted glass based article has a scratch threshold force of about 10 N, about 12 N, about 14 N, about 16 N, about 18 N, about 20 N, about 22 N, about 24 N, about 26 N, about 28 N, about 30 N, or any ranges between the specified value. Scratch threshold force relates to the lateral scratch threshold limit and scratch visibility and can be determined by Knoop scratch threshold testing.

Typically, the ion-implanted glass based article has a scratch threshold force of at least 1.25-fold (e.g., at least 1.5-fold, at least 2-fold, at least 4-fold, at least 6-fold, at least 8-fold, or at least 10-fold) of an initial scratch threshold force of the glass based article prior to ion-implantation. In some embodiments, the ion-implanted glass based article has a scratch threshold force of about 1.5-fold, about 2-fold, about 4-fold, about 6-fold, about 10-fold, or any ranges between the specified value, of the initial scratch threshold force of the glass based article prior to ion-implantation. In some embodiments, the initial scratch threshold force of the glass based article prior to ion-implantation can be at least 2 N (e.g., at least 4 N, at least 6 N, at least 8 N, at least 10 N, or at least 16 N). In some embodiments, the initial scratch threshold force of the glass based article prior to ion-implantation can be about 2 N, about 4 N, about 6 N, about 8 N, about 10 N, about 12 N, about 14 N, about 16 N, or any ranges between the specified values.

The scratch threshold force described herein is determined by Knoop scratch threshold testing, to understand the lateral scratch threshold limit and scratch visibility. The Knoop indenter is same as the one used in standard micro hardness testing (reference ASTM-E384-11). Scratches of constant load are generated, 5 scratches per load, generated at a speed of 0.4 mm/sec. Typical length of the scratch is about 10 mm, and scratches are separated by at least 3 mm. The measurement unit is Newtons (N). For samples with unknown history, the starting load is 0.25N and increased with a delta of 0.25 until 1N load is reached and >1N the delta increase is 1N and beyond 10N the delta increase is 2N. The load is increased starting from 0.25N until the lateral scratch threshold limit is reached. The samples are inspected after a period of at least 12 hrs under microscope. The lateral scratch threshold range is determined by comparing the test specimen to one of the following failure modes: 1) sustained lateral surface cracks that are more than two times the width of the groove or 2) the presence of large subsurface lateral cracks which are greater than two times the width of groove and/or there is a median crack at the vertex of the scratch. At least three of the five scratches must meet criteria 1 or 2 above for that load to be deemed the threshold load, and this load must be the minimum load at which this occurs. For example, supposed that at 5N load only one scratch meets the criteria, but at 6N load 3 out of 5 scratches meet the criteria. The threshold load is then expressed as >5N, and <6N. It is convenient to take the midpoint, such that the Knoop scratch threshold would be given as 5.5N.

Figure 6:
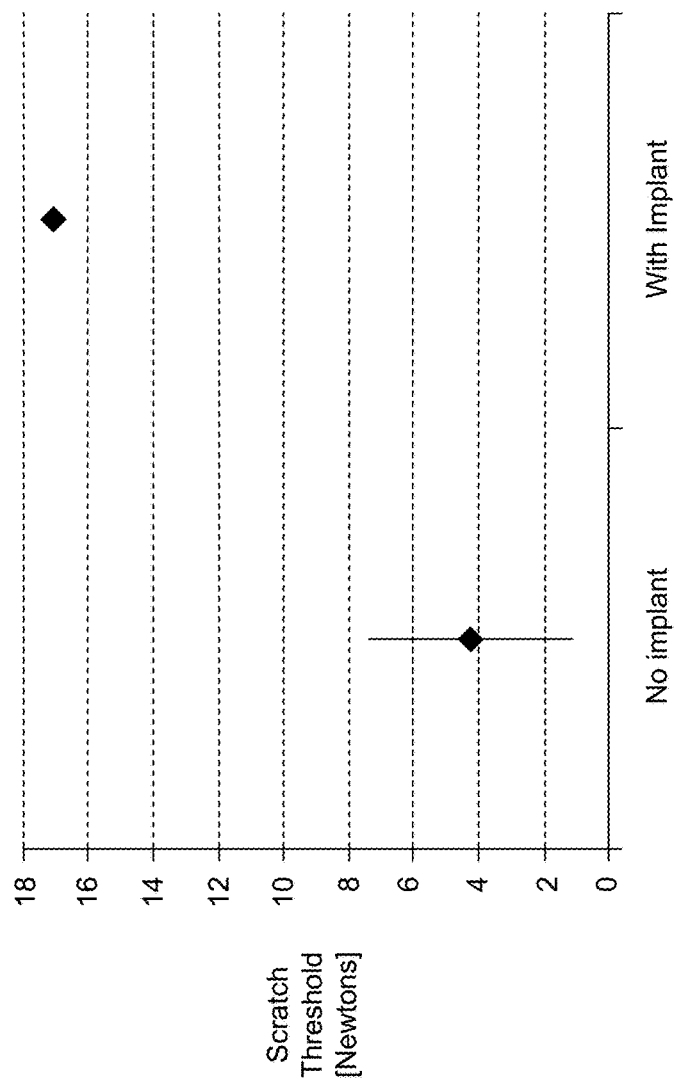
FIG. 6 shows a graph comparing the Scratch Threshold Force of Eagle XG® glasses in their native state (i.e. non-ion-implanted), as control glasses, with the Scratch Threshold Force observed for the corresponding glasses after ion-implantation.

The effect of ion-implantation on scratch threshold is shown in FIG. 6. FIG. 6 shows that native Eagle XG® glass's resistance to scratch damage is strongly enhanced after N$^+$ ion implantation, with a more than 4 fold enhancement, from 4 N to above 16 N.

The ion-implanted glass based article with high resistance to damage from scratching can be prepared from various glass or glass ceramic substrates (e.g., those described herein). In some embodiments, the glass or glass ceramic substrate is glass or glass ceramic substrate that is an alkali-free glass, an alkali glass, an alkaline earth boroaluminosilicate glass (e.g., Corning Eagle XG®), an alkali alumino silicate glass (e.g., glass A), or an alkali aluminoborosilicate glass (e.g., glass C). In some embodiments, the glass or glass ceramic substrate is an alkaline earth boroaluminosilicate glass. In some embodiments, the glass or glass ceramic substrate is an alkali aluminoborosilicate glass. In some embodiments, the glass or glass ceramic substrate is an alkali aluminosilicate glass comprising about 61 mol % to about 75 mol % $SiO_2$; about 7 mol % to about 15 mol % $Al_2O_3$; 0 mol % to about 12 mol % $B_2O_3$; about 9 mol % to about 21 mol % $Na_2O$; 0 mol % to about 4 mol % $K_2O$; 0 mol % to about 7 mol % MgO; and 0 mol % to about 3 mol % CaO. In some embodiments, the glass or glass ceramic substrate is an alkali aluminosilicate glass comprising (in mol %) 69.49% $SiO_2$, 8.45% $Al_2O_3$, 14.01% $Na_2O$, 1.16% $K_2O$, 0.185% $SnO_2$, 0.507% CaO, 6.2% MgO, 0.01% $ZrO_2$, and 0.008% $Fe_2O_3$. In some embodiments, the glass or glass ceramic substrate comprises an ion-exchanged glass or glass ceramic substrate (e.g., a partially ion-exchanged glass or glass ceramic substrate). In some embodiments, the glass or glass ceramic substrate is not suitable for an ion-exchange process. For example, the glass or glass ceramic substrate may not contain ions (e.g., alkali ions such as $Li^+$, $Na^+$, $K^+$, etc.) that can be exchanged in a typical ion-exchange process (e.g., a process using molten nitrates). In other embodiments, the glass or glass ceramic substrate may be too thin (e.g., not more than 500 um) such that an ion exchange treatment (even a partial ion-exchange process) leads to the breakage of the substrate. Preferably, the glass or glass ceramic substrate is an alkaline earth boroaluminosilicate glass (e.g., Corning Eagle XG®).

Improved Resistance to Sharp Contact Damages

The ion-implanted glass based articles described herein also have improved performance against sharp contact damage introduction failure, as determined by the Ball on Sandpaper (BoS) test and/or the inverted Ball on Sandpaper (IBoS) test.

Ball on Sandpaper

Generally, the ion-implanted glass based articles described herein have a sharp contact damage introduction failure resistance (as measured by the BoS test) that is higher than glasses such as ion exchanged soda lime, other types of ion exchanged glasses, or display glasses with high native IFT's. In some embodiments, the ion-implanted glass based articles described herein can be characterized by having a standardized 4.2 g ball drop failure height of at least 120 cm (e.g., at least 140 cm, at least 160 cm, at least 180 cm, at least 200 cm, or at least 220 cm) as measured by the BoS test. In some embodiments, the ion-implanted glass based articles described herein can be characterized by having a standardized 4.2 g ball drop failure height of about 120 cm, about 140 cm, about 160 cm, about 180 cm, about 200 cm, about 220 cm, or any ranges between the specified values, as measured by the BoS test. Typically, the ion-implanted glass based article has a standardized 4.2 g ball drop failure height of at least 20% (e.g., at least 30%, at least 40%, at least 50%, at least 75%, at least 100%, or at least 200%) higher than those observed for the glass based article prior to ion-implantation. In some embodiments, the ion-implanted glass based article has a standardized 4.2 g ball drop failure height of about 20%, about 30%, about 40%, about 50%, about 75%, about 100%, about 200%, or any ranges between the specified values, higher than those observed for the glass based article prior to ion-implantation.

The BoS test has been described by A. Nakagawa, et al., in "Establishment of Evaluation Method of Surface Fracture Mode with Front-side-origin for Cover Glass" *SID Symposium Digest of Technical Papers*. 44(1): 1148-1151 (2013). A typical ball drop test is shown in FIG. 7A, which is also described in U.S. Publication No. 2015/0239776. The ball drop test assembly 250 includes a solid, hard substrate 212 such as a granite slab or the like and a steel ball 230 of predetermined mass and diameter. A glass sample 220 is secured to the substrate 212, and a piece of sandpaper 214 having the desired grit is placed on the upper surface of the glass sample 220 opposite the substrate 212. The sandpaper 214 is placed on the glass sample 220 such that the roughened surface 214 a of the sandpaper contacts the upper surface 222 (an ion-implanted surface) of the glass sample 220. The steel ball 230 is allowed to fall freely from a predetermined height h onto the sandpaper 214. The upper surface 222 or compression face of the glass sample 220 makes contact with the roughened surface 214 a of the sandpaper 214, introducing cracks into the surface of the upper surface/compression face 222. The height h may be increased incrementally until either a maximum height is reached or the glass sample fractures.

Figure 7B:
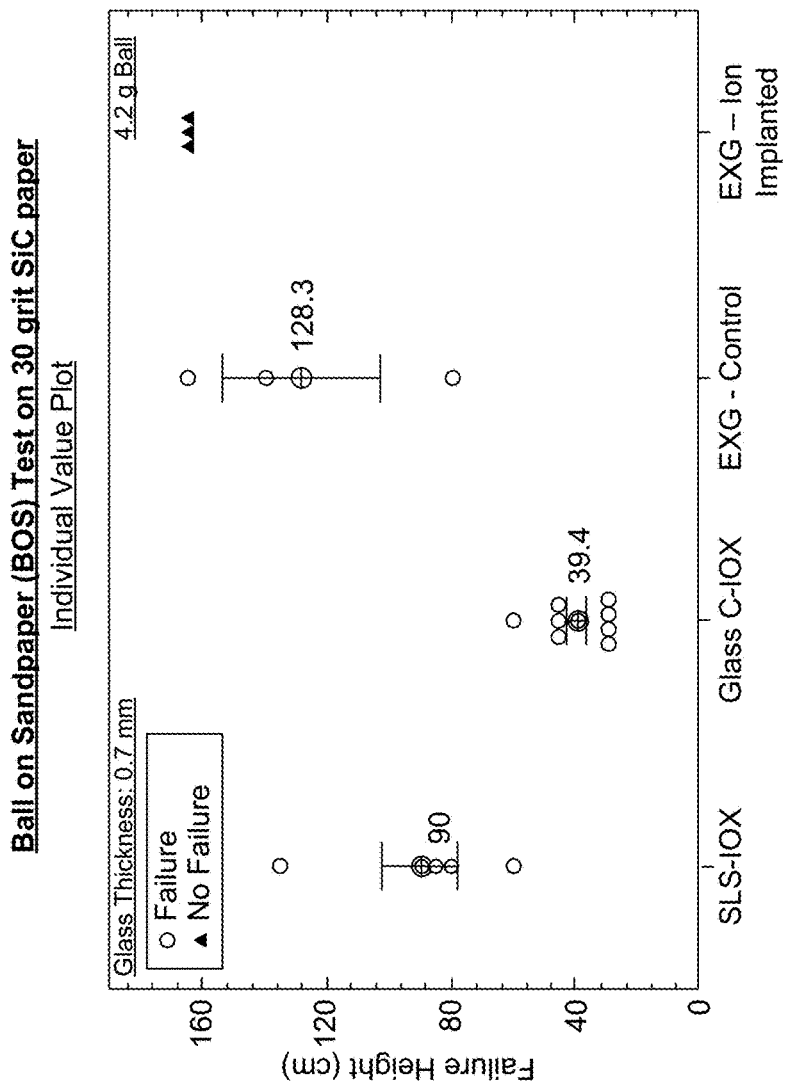
FIG. 7B shows a graph comparing the failure height of various glasses (ion-exchanged soda lime glass (SLS-IOX), ion-exchanged Glass C, and native (i.e. non-ion-implanted) Eagle XG® Glass with ion-implanted Eagle XG® Glass (EXG) in the BoS test.

The improved performance against sharp contact damage introduction failure (as measured by the BoS test using 0.7 mm glasses and 30 grit SiC as the sandpaper) through ion implantation is illustrated in FIG. 7B. As shown in FIG. 7B, ion implanted Eagle XG® glass shows a much higher failure height, with a failure height of at least 160 cm, than soda-lime, (failure height of about 90 cm). FIG. 7B further shows that a low internal stress treatment like ion implantation on a high native IFT glass like Eagle XG®, produces a glass based article with superior flaw suppression. Table 2 shows the composition of Glass C:

TABLE 2

| Composition of Glass C | |
|---|---|
| Oxide | Mol % |
| $SiO_2$ | 67.37 |
| $B_2O_3$ | 3.67 |
| $Al_2O_3$ | 12.73 |
| $Na_2O$ | 13.77 |
| $K_2O$ | 0.010 |
| MgO | 2.39 |
| $TiO_2$ | 0.003 |
| $Fe_2O_3$ | 0.010 |
| $ZrO_2$ | 0.010 |
| $SnO_2$ | 0.09 |

Inverted Ball on Sandpaper

The ion-implanted glass based articles described herein also have improved performance against sharp contact damage introduction failure as determined by the inverted Ball on Sandpaper (IBoS) test. The IBoS test measures the sharp contact damage introduction failure resistance when the impacted surface is convexly flexed. The convex flexure imparts tensile stress to the impacted surface. Ion exchanged glasses, due to their compressively stressed surfaces, perform somewhat better in this test versus the BoS test.

The ion-implanted glass based articles described herein have a sharp contact damage introduction failure resistance (as measured by the IBoS test) that is higher than the corresponding native glass based articles, i.e., prior to ion-implantation. In some embodiments, the ion-implanted glass based articles described herein can be characterized by having a standardized 4.2 g ball inverted drop failure height of at least about 40 cm, at least about 45 cm, at least about 50 cm, at least about 55 cm, at least about 60 cm, or about 40 cm to about 60 cm (e.g., about 40 cm, about 45 cm, about 50 cm, about 55 cm, about 60 cm, or any ranges between the specified values) as measured by the IBoS test. Typically, the ion-implanted glass based article has a standardized 4.2 g ball invert drop failure height of at least 10% (e.g., at least 20%, at least 25%, at least 30%, at least 35%, or at least 40%) higher than those observed for the glass based article prior to ion-implantation. In some embodiments, the ion-implanted glass based article has a standardized 4.2 g ball invert drop failure height of about 10%, about 20%, about 25%, about 30%, about 35%, about 40%, or any ranges between the specified values, higher than those observed for the glass based article prior to ion-implantation.

Figure 8A:
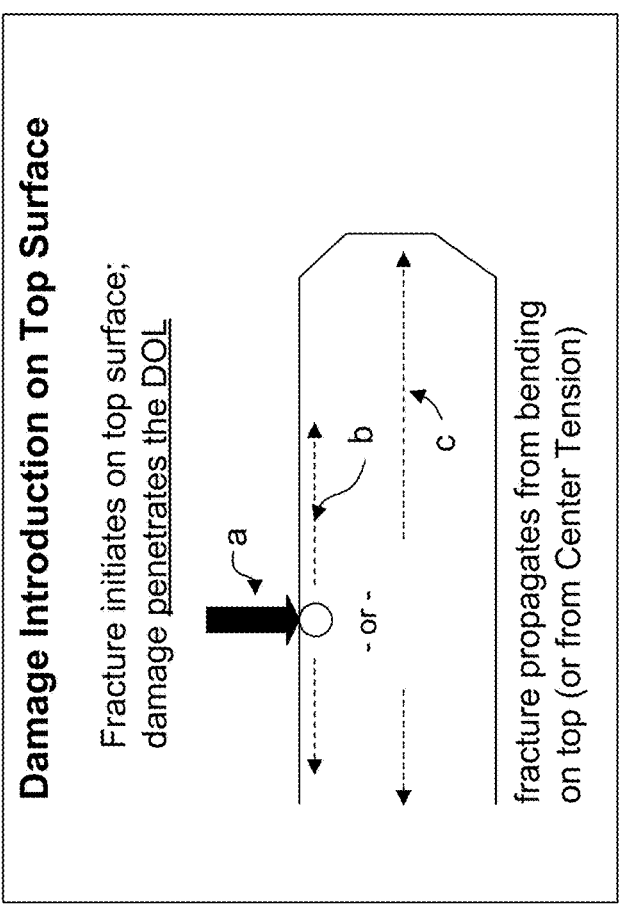
FIG. 8A shows damage introduction during an inverted Ball on Sandpaper test ("IBoS").

An inverted ball on sandpaper (IBoS) test is a dynamic component level test that mimics the dominant mechanism for failure due to damage introduction plus bending that typically occurs in strengthened glass based articles that are used in mobile or hand held electronic devices, as schematically shown in FIG. 8A, which is also described in U.S. Publication No. 2015/0239776. In the field, damage introduction (a in FIG. 8A) occurs on the top surface of the glass. Fracture initiates on the top surface of the glass and damage either penetrates the compressive layer (b in FIG. 8A) or the fracture propagates from bending on the top surface or from center tension (c in FIG. 8A). The IBoS test is designed to simultaneously introduce damage to the surface of the glass and apply bending under dynamic load.

Figure 8B:
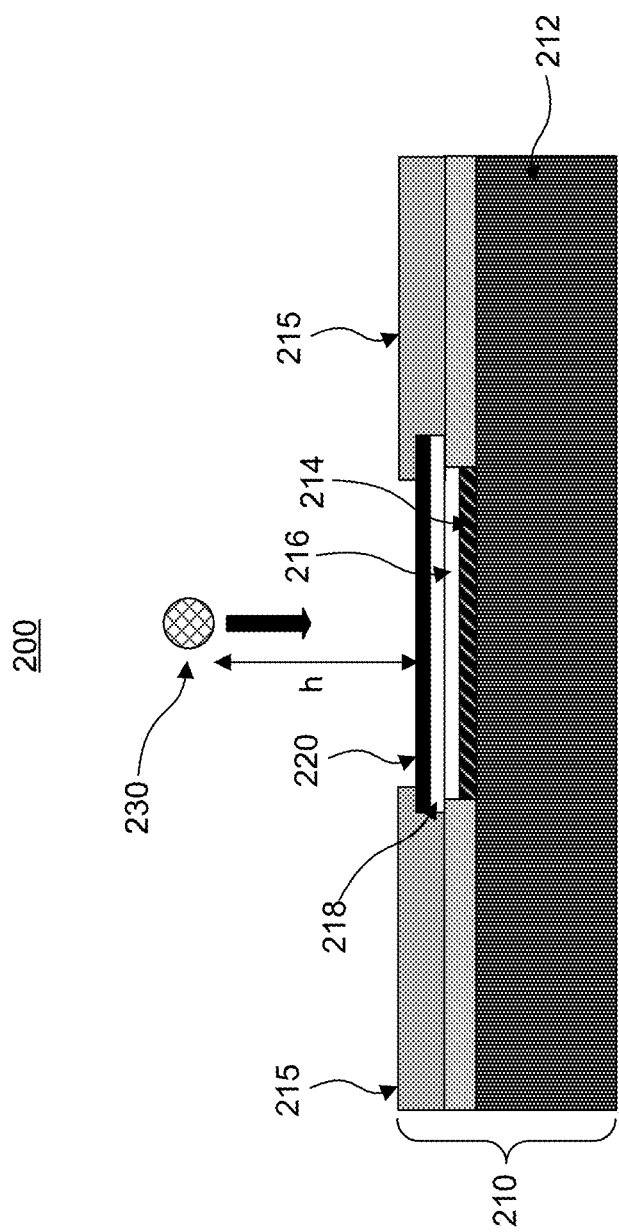
FIG. 8B shows an exemplary apparatus for use in the IBoS test.

An IBoS test apparatus is schematically shown in FIG. 8B. Apparatus 200 includes a test stand 210 and a ball 230. Ball 230 is a rigid or solid ball such as, for example, a stainless steel ball, or the like. In one embodiment, ball 230 is a 4.2 gram stainless steel ball having diameter of 10 mm. The ball 230 is dropped directly onto the glass sample 218 from a predetermined height h. Test stand 210 includes a solid base 212 comprising a hard, rigid material such as granite or the like. A sheet 214 having an abrasive material disposed on a surface is placed on the upper surface of the solid base 212 such that surface with the abrasive material faces upward. In some embodiments, sheet 214 is sandpaper having a 30 grit surface and, in other embodiments, a 180 grit surface. Glass sample 218 is held in place above sheet 214 by sample holder 215 such that an air gap 216 exists between glass sample 218 and sheet 214. The air gap 216 between sheet 214 and glass sample 218 allows the glass sample 218 to bend upon impact by ball 230 and onto the abrasive surface of sheet 214. In one embodiment, the glass sample 218 is clamped across all corners to keep bending contained only to the point of ball impact and to ensure repeatability. In some embodiments, sample holder 214 and test stand 210 are adapted to accommodate sample thicknesses of up to about 2 mm. The air gap 216 is in a range from about 50 μm to about 100 μm. An adhesive tape 220 may be used to cover the upper surface of the glass sample to collect fragments in the event of fracture of the glass sample 218 upon impact of ball 230.

Various materials may be used as the abrasive surface. In a one particular embodiment, the abrasive surface is sandpaper, such as silicon carbide or alumina sandpaper, engineered sandpaper, or any abrasive material known to those skilled in the art for having comparable hardness and/or sharpness. In some embodiments, sandpaper having 30 grit may be used, as it has a surface topography that is more consistent than either concrete or asphalt, and a particle size and sharpness that produces the desired level of specimen surface damage.

Figure 8C:
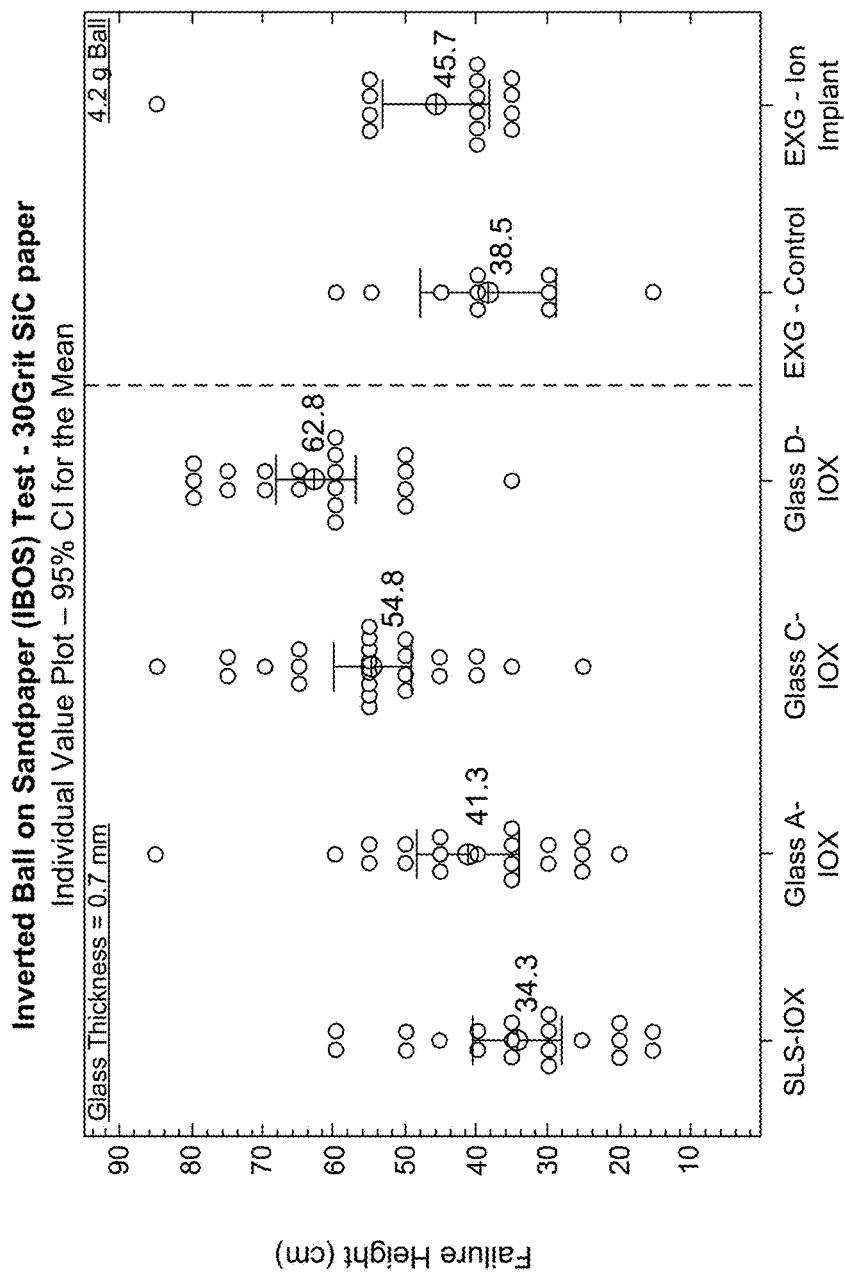
FIG. 8C shows a graph comparing the failure height of various glasses (ion-exchanged soda lime glass (SLS-IOX), ion-exchanged Glass C, ion-exchanged glass A, and dual ion-exchanged Glass D and native (i.e. non-ion-implanted) Eagle XG® Glass with ion-implanted Eagle XG® Glass (EXG) in the inverted BoS test.

The improved performance against sharp contact damage introduction failure (as measured by the IBoS test using 30 grit SiC as the sandpaper) through ion implantation is illustrated in FIG. 8C. In the IBoS test, ion implanted Eagle XG® glass has an inverted ball failure height of about 45.7 cm, which is superior to ion exchanged soda lime (failure height of about 34.3 cm) and is improved (about 20% higher) over native Eagle XG® (failure height of about 38.5 cm). In this test, the ion-exchanged glasses performed better. The composition of glass C is described above in Table 2. Table 3 shows the composition of Glass D:

TABLE 3

Composition of Glass D

| Oxide | Mol % |
|---|---|
| $SiO_2$ | 57.43 |
| $Al_2O_3$ | 16.10 |
| $Na_2O$ | 17.05 |
| MgO | 2.81 |
| $TiO_2$ | 0.003 |
| $SnO_2$ | 0.07 |
| $P_2O_5$ | 6.54 |

Devices

Ion-implantation process is ideal for thin glass applications such as screen protectors, in comparison to ion exchanged glasses where high center tension has been shown to reduce drop performance. Ion implanted glass based articles tested here showed minimal amount optical distortion and minimal loss of transparency. In various embodiments, the ion-implanted glass based articles described herein can be used in displays, such as computer monitors, laptops, tablets, hand held devices, or screen protectors.

Figure 9A:
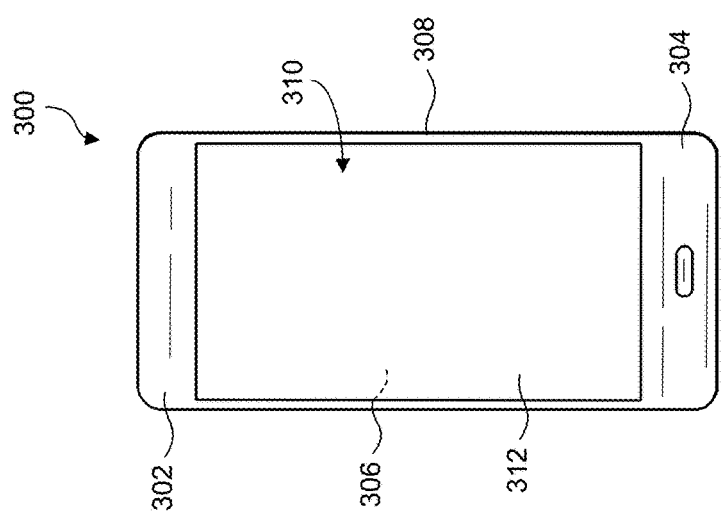
FIG. 9A is a plan view of an exemplary electronic device incorporating any of the ion-implanted glasses disclosed herein.
Figure 9B:
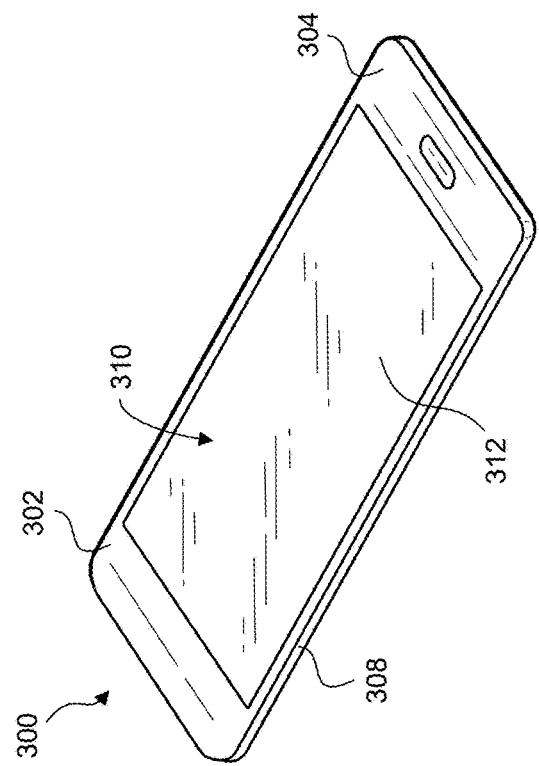
FIG. 9B is a perspective view of the exemplary electronic device of FIG. 9A.

For example, the ion-implanted glass based articles disclosed herein may be incorporated into another article such as an article with a display (or display articles) (e.g., consumer electronics, including mobile phones, tablets, computers, laptops, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the ion-implanted glass based articles disclosed herein is shown in FIGS. 9A and 9B. Specifically, FIGS. 9A and 9B show a consumer electronic device 300 including a housing 302 having front 304, back 306, and side surfaces 308; electrical components (not shown) that are at least partially inside or entirely within the housing and including at least a controller, a memory, and a display 310 at or adjacent to the front surface of the housing; and a cover substrate 312 at or over the front surface of the housing such that it is over the display. In some embodiments, the cover substrate 312 may include any of the ion-implanted glass based articles disclosed herein.

In an aspect (1), an article comprises a glass or glass ceramic substrate comprising at least one ion-implanted surface, wherein the ion-implanted glass or glass ceramic article is characterized by having a final indent fracture threshold (IFT) load of at least 650 grams.

An aspect (2) according to aspect (1), wherein the at least one surface is implanted with ions selected from the group consisting of $N^+$, $Si^+$, $BF_2^+$, $P^+$, $SiF_3^+$, $N_2^+$, and combinations thereof.

An aspect (3) according to an aspect (2), wherein the ions are implanted at a dose ranging from about $4 \times 10^{14}$ ions/cm$^2$ to about $2.1 \times 10^{17}$ ions/cm$^2$.

An aspect (4) according to any preceding aspect, wherein the glass or glass ceramic substrate is not suitable for an ion-exchange process.

An aspect (5) according to any of aspects (1)-(3), wherein the glass or glass ceramic substrate comprises an alkali or alkali-free glass composition, an alkaline earth boroaluminosilicate glass composition, or an alkali aluminosilicate glass composition.

An aspect (6) according to any preceding aspect, having a mean thickness of not more than 2 mm.

An aspect (7) according to any preceding aspect, wherein the ions are implanted with an average depth of not more than 5 μm under the at least one surface.

An aspect (8) according to any preceding aspect, further characterized by having i) the final IFT load of at least 1.25-fold of an initial IFT load of the glass based article prior to ion-implantation, wherein the initial IFT load of the glass based article prior to ion-implantation is at least 100 grams; ii) a scratch threshold force of at least 10 N; iii) a standardized 4.2 g ball drop failure height of at least 120 cm when dropped on 30 grit silicon carbide sandpaper; iv) a standardized 4.2 g inverted ball drop failure height of at least about 40 cm when dropped on 30 grit silicon carbide sandpaper positioned above the surface of the glass so there is a 100 μm air gap between the sandpaper and the surface of the glass, or a combination thereof.

An aspect (9) according to any preceding aspect, further characterized by having i) the final IFT load of about 1.5-fold to about 10 fold of an initial IFT load of the glass based article prior to ion-implantation, wherein the initial IFT load of the glass based article prior to ion-implantation is at least 100 grams; ii) the final IFT load of about 650 grams to about 5000 grams; iii) a scratch threshold force of about 10 N to about 30 N, or a combination thereof.

An aspect (10) according to any preceding aspect, wherein the article is an electronic device, the electronic device comprising a housing, a display, and a cover substrate, wherein the display is provided at or adjacent to a front surface of the housing, wherein the cover substrate is provided at or over the front surface of the housing and over the display, and wherein the at least one of the cover substrate and a portion of the housing comprises the glass or glass ceramic substrate.

An aspect (11) according to any of aspects (1) to (10), consisting essentially of the glass or glass ceramic substrate.

In an aspect (12), a process comprises implanting a dose of ions under at least one surface of a glass or glass ceramic substrate; wherein the glass or glass ceramic substrate is characterized by having an initial indent fracture threshold (IFT) load of at least 100 grams; and wherein the ion-implanted glass based article is characterized by having a final IFT load of at least 1.25-fold of the IFT load of the glass or glass ceramic substrate, a scratch threshold force of at least 10 N, or a combination thereof.

An aspect (13) according to aspect (12), wherein the ions comprise ions selected from the group consisting of N$^+$, Si$^+$, BF$_2^+$, P$^+$, SiF$_3^+$, N$_2^+$, and a combination thereof.

An aspect (14) according to aspect (12) or (13), wherein the dose of the ions is in the range of about $4 \times 10^{14}$ ions/cm$^2$ to about $2.1 \times 10^{17}$ ions/cm$^2$.

An aspect (15) according to any one of aspects (12)-(14), wherein the implanting step is conducted at an implantation energy of about 45 keV to about 2000 keV.

An aspect (16) according to any one of aspects (12)-(15), wherein the implanting step is conducted at a beam current of about 1 milliamp to about 4 milliamps.

An aspect (17) according to any one of aspects (12)-(16), wherein the glass or glass ceramic substrate is not suitable for an ion-exchange process.

An aspect (18) according to any one of aspects (12)-(17), wherein the glass or glass ceramic substrate is an ion-exchanged glass or glass ceramic substrate.

An aspect (19) according to any one of aspects (12)-(18), wherein the glass or glass ceramic substrate has a mean thickness of not more than 2 mm.

An aspect (20) according to any one of aspects (12)-(19), wherein the ions are implanted with an average depth of not more than 5 μm under the at least one surface of the glass or glass ceramic substrate.

An aspect (21) according to any one of aspects (12)-(20), wherein the ion-implanted glass based article is further characterized by having i) the final IFT load of about 1.5-fold to about 10 fold of an initial IFT load of the glass based article prior to ion-implantation; ii) the final IFT load of about 650 grams to about 5000 grams; iii) a scratch threshold of about 10 N to about 30 N; iv) a standardized 4.2 g ball drop failure height of at least 120 cm when dropped on 30 grit silicon carbide sandpaper; v) a standardized 4.2 g inverted ball drop failure height of at least about 40 cm when dropped on 30 grit silicon carbide sandpaper positioned above the surface of the glass so there is a 100 μm air gap between the sandpaper and the surface of the glass, or a combination thereof.

An aspect (22), including an ion-implanted glass based article produced by any one of aspects (12)-(21).

In an aspect (23), an electronic device comprises a housing; a display provided at or adjacent to a front surface of the housing; and a cover substrate provided at or over the front surface of the housing and over the display, wherein at least one of the cover substrate and a portion of the housing comprises an ion-implanted glass based article comprises a glass or glass ceramic substrate comprising at least one ion-implanted surface and is characterized by having an indent fracture threshold load of about 650 grams to about 5000 grams, a scratch threshold of about 10 N to about 30 N, or a combination thereof.

In an aspect (24), an article comprises a glass or glass ceramic substrate comprising at least one ion-implanted surface, wherein the ion-implanted glass based article is characterized by having a scratch threshold force of at least 10 N.

An aspect (25) according to aspect (24), wherein the at least one surface is implanted with ions selected from the group consisting of N$^+$, Si$^+$, BF$_2^+$, P$^+$, SiF$_3^+$, N$_2^+$, and combinations thereof.

An aspect (26) according to aspect (25), wherein the ions are implanted at a dose ranging from about $4 \times 10^{14}$ ions/cm$^2$ to about $2.1 \times 10^{17}$ ions/cm$^2$.

An aspect (27) according to any one of aspects (24)-(26), further characterized by having i) a final IFT load of about 1.5-fold to about 10 fold of an initial IFT load of the glass based article prior to ion-implantation, wherein the initial IFT load of the glass based article prior to ion-implantation is at least 100 grams; ii) a final IFT load of about 650 grams to about 5000 grams; iii) a scratch threshold force of 10 N to about 30 N, iv) a standardized 4.2 g ball drop failure height of at least 120 cm when dropped on 30 grit silicon carbide sandpaper; v) a standardized 4.2 g inverted ball drop failure height of at least about 40 cm when dropped on 30 grit silicon carbide sandpaper positioned above the surface of the glass so there is a 100 µm air gap between the sandpaper and the surface of the glass, or a combination thereof.

An aspect (28) according to any one of aspects (24)-(27), wherein the article is an electronic device, the electronic device comprising a housing, a display, and a cover substrate, wherein the display is provided at or adjacent to a front surface of the housing, wherein the cover substrate is provided at or over the front surface of the housing and over the display, and wherein the at least one of the cover substrate and a portion of the housing comprises the glass or glass ceramic substrate.

In an aspect (29), an article comprises a glass or glass ceramic substrate comprising at least one ion-implanted surface, wherein the glass or glass ceramic substrate is an ion-exchanged glass or glass ceramic substrate.

An aspect (30) according to aspect (29), wherein the glass or glass ceramic substrate is a partially ion-exchanged glass or glass ceramic substrate.

An aspect (31) according to aspect (29) or (30), characterized by having a final indent fracture threshold (IFT) load of at least 650 grams, a scratch threshold force of at least 10 N, or a combination thereof.

An aspect (32) according to any one of aspects (29)-(31), wherein the article is an electronic device, the electronic device comprising a housing, a display, and a cover substrate, wherein the display is provided at or adjacent to a front surface of the housing, wherein the cover substrate is provided at or over the front surface of the housing and over the display, and wherein the at least one of the cover substrate and a portion of the housing comprises the glass or glass ceramic substrate.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments.

All of the various aspects, embodiments, and options described herein can be combined in any and all variations.

All publications, patents, and patent applications mentioned in this specification are herein incorporated by reference to the same extent as if each individual publication, patent, or patent application was specifically and individually indicated to be incorporated by reference.

What is claimed:

1. An article comprising
a glass or glass ceramic substrate comprising at least one ion-implanted surface, wherein the at least one surface is implanted with ions selected from the group consisting of $N^+$, $Si^+$, $BF_2^+$, $P^+$, $SiF_3^+$, $N_2^+$, and combinations thereof, with a dose of ions in a range of $4 \times 10^{14}$ ions/cm$^2$ to $2.1 \times 10^{17}$ ions/cm$^2$;

wherein the ion-implanted glass or glass ceramic article has a final indent fracture threshold (IFT) load of 650 grams to 5000 grams.

2. The article of claim 1, wherein the glass or glass ceramic substrate comprises an alkali or alkali-free glass composition, an alkaline earth boroaluminosilicate glass composition, or an alkali aluminosilicate glass composition.

3. The article of claim 1, having a mean thickness of not more than 2 mm.

4. The article of claim 1, wherein the ions are implanted with an average depth of not more than 5 µm under the at least one surface.

5. The article of claim 1, further characterized by having i) the final IFT load of at least 1.25-fold of an initial IFT load of the glass based article prior to ion-implantation, wherein the initial IFT load of the glass based article prior to ion-implantation is at least 100 grams; ii) a scratch threshold force of at least 10 N; iii) a standardized 4.2 g ball drop failure height of at least 120 cm when dropped on 30 grit silicon carbide sandpaper; iv) a standardized 4.2 g inverted ball drop failure height of at least about 40 cm when dropped on 30 grit silicon carbide sandpaper positioned above the surface of the glass so there is a 100 µm air gap between the sandpaper and the surface of the glass, or a combination thereof.

6. The article of claim 1, further characterized by having i) the final IFT load of about 1.5-fold to about 10 fold of an initial IFT load of the glass based article prior to ion-implantation, wherein the initial IFT load of the glass based article prior to ion-implantation is at least 100 grams; ii) the final IFT load of about 650 grams to about 5000 grams; iii) a scratch threshold force of about 10 N to about 30 N, or a combination thereof.

7. The article of claim 1, wherein the article is an electronic device, the electronic device comprising a housing, a display, and a cover substrate, wherein the display is provided at or adjacent to a front surface of the housing, wherein the cover substrate is provided at or over the front surface of the housing and over the display, and wherein the at least one of the cover substrate and a portion of the housing comprises the glass or glass ceramic substrate.

8. The article of claim 1, consisting essentially of the glass or glass ceramic substrate.

9. An article comprising a glass or glass ceramic substrate comprising at least one ion-implanted surface, wherein the at least one surface is implanted with ions selected from the group consisting of $N^+$, $Si^+$, $BF_2^+$, $P^+$, $SiF_3^+$, $N_2^+$, and combinations thereof, with a dose of ions in a range of $4 \times 10^{14}$ ions/cm$^2$ to $2.1 \times 10^{17}$ ions/cm$^2$, wherein the ion-implanted glass based article has a scratch threshold force of 10 N to 30 N.

10. The article of claim 9, further characterized by having i) a final IFT load of about 1.5-fold to about 10 fold of an initial IFT load of the glass based article prior to ion-implantation, wherein the initial IFT load of the glass based article prior to ion-implantation is at least 100 grams; ii) a final IFT load of about 650 grams to about 5000 grams; iii) a scratch threshold force of 10 N to about 30 N, iv) a standardized 4.2 g ball drop failure height of at least 120 cm when dropped on 30 grit silicon carbide sandpaper; v) a standardized 4.2 g inverted ball drop failure height of at least about 40 cm when dropped on 30 grit silicon carbide sandpaper positioned above the surface of the glass so there is a 100 µm air gap between the sandpaper and the surface of the glass, or a combination thereof.

11. The article of claim 9, wherein the article is an electronic device, the electronic device comprising a housing, a display, and a cover substrate, wherein the display is provided at or adjacent to a front surface of the housing, wherein the cover substrate is provided at or over the front surface of the housing and over the display, and wherein the at least one of the cover substrate and a portion of the housing comprises the glass or glass ceramic substrate.

12. An article comprising a glass or glass ceramic substrate comprising at least one ion-implanted surface, wherein the glass or glass ceramic substrate is an ion-exchanged glass or glass ceramic substrate.

13. The article of claim 12, wherein the glass or glass ceramic substrate is a partially ion-exchanged glass or glass ceramic substrate.

14. The article of claim 12, characterized by having a final indent fracture threshold (IFT) load of at least 650 grams, a scratch threshold force of at least 10 N, or a combination thereof.

15. The article of claim 12, wherein the article is an electronic device, the electronic device comprising a housing, a display, and a cover substrate, wherein the display is provided at or adjacent to a front surface of the housing, wherein the cover substrate is provided at or over the front surface of the housing and over the display, and wherein the at least one of the cover substrate and a portion of the housing comprises the glass or glass ceramic substrate.

* * * * *